United States Patent
Rahmani et al.

(10) Patent No.: US 11,119,616 B2
(45) Date of Patent: Sep. 14, 2021

(54) TRACE TRANSFER TECHNIQUES FOR TOUCH SENSOR PANELS WITH FLEX CIRCUITS

(71) Applicant: Apple Inc., Cupertino, CA (US)

(72) Inventors: Helia Rahmani, Mountain View, CA (US); Prithu Sharma, Cupertino, CA (US); David Sheldon Schultz, Berkeley, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/661,847

(22) Filed: Oct. 23, 2019

(65) Prior Publication Data
US 2020/0142540 A1    May 7, 2020

Related U.S. Application Data

(60) Provisional application No. 62/754,558, filed on Nov. 1, 2018, provisional application No. 62/812,172, filed
(Continued)

(51) Int. Cl.
| | |
|---|---|
| *G06F 3/044* | (2006.01) |
| *H05K 1/02* | (2006.01) |
| *H05K 1/11* | (2006.01) |
| *H05K 1/14* | (2006.01) |
| *H05K 1/09* | (2006.01) |

(52) U.S. Cl.
CPC ......... *G06F 3/0446* (2019.05); *H05K 1/0277* (2013.01); *H05K 1/092* (2013.01); *H05K 1/111* (2013.01); *H05K 1/14* (2013.01); *G06F 2203/04103* (2013.01); *G06F 2203/04108* (2013.01); *H05K 2201/0326* (2013.01); *H05K 2201/10121* (2013.01)

(58) Field of Classification Search
None
See application file for complete search history.

(56) References Cited

U.S. PATENT DOCUMENTS

| | | |
|---|---|---|
| 5,876,427 A | 3/1999 | Chen et al. |
| 8,026,903 B2 | 9/2011 | Hamblin et al. |
| (Continued) | | |

FOREIGN PATENT DOCUMENTS

| | | |
|---|---|---|
| CN | 202281986 U | 6/2012 |
| CN | 103260334 A | 8/2013 |
| (Continued) | | |

*Primary Examiner* — Krishna P Neupane
(74) *Attorney, Agent, or Firm* — Kubota & Basol LLP

(57) ABSTRACT

Trace transfer techniques can be used to couple touch electrodes to touch sensing circuitry with a reduced border region around a touch sensor panel. Touch electrodes on a first side of the substrate can be routed to a bond pad region on the second side of the substrate via a trace transfer technique to enable single-sided bonding of a double-sided touch sensor panel. Trace transfer techniques can also be used to couple conductive traces on a first side of the substrate to a flex circuit oriented perpendicular to or otherwise not parallel to the first side of the substrate. Orienting the flex circuit in this way can allow the flex circuit to connect to touch circuitry with reduced bending as compared with the amount of bending of the flex circuit when oriented substantially parallel to the substrate.

21 Claims, 17 Drawing Sheets

Related U.S. Application Data on Feb. 28, 2019, provisional application No. 62/872,054, filed on Jul. 9, 2019.

(56) References Cited

U.S. PATENT DOCUMENTS

| | | | |
|---|---|---|---|
| 8,358,276 B2 | 1/2013 | Hotelling et al. | |
| 8,549,738 B2 | 10/2013 | Grunthaner | |
| 8,693,202 B2 | 4/2014 | Yoshifusa | |
| 8,730,179 B2 | 5/2014 | Rosenblatt et al. | |
| 9,084,357 B2 | 7/2015 | Shedletsky et al. | |
| 9,160,332 B2 | 10/2015 | Guard | |
| 9,235,286 B2 | 1/2016 | Nakano et al. | |
| 9,939,973 B2 | 4/2018 | Kim et al. | |
| 10,403,703 B2 | 9/2019 | Yamazaki | |
| 2002/0008809 A1 | 1/2002 | Babuka et al. | |
| 2008/0158181 A1* | 7/2008 | Hamblin | G06F 3/0416 345/173 |
| 2009/0283300 A1* | 11/2009 | Grunthaner | H05K 1/118 174/254 |
| 2011/0094670 A1* | 4/2011 | Grunthaner | H05K 1/147 156/250 |
| 2011/0279409 A1* | 11/2011 | Salaverry | G06F 3/0416 345/174 |
| 2013/0088671 A1 | 4/2013 | Drzaio et al. | |
| 2014/0375907 A1 | 12/2014 | Wu | |
| 2015/0160760 A1 | 6/2015 | Sato | |
| 2015/0162388 A1* | 6/2015 | Kim | G06F 1/1637 257/40 |
| 2015/0234486 A1 | 8/2015 | Huang et al. | |
| 2015/0241906 A1* | 8/2015 | Tsai | G06F 3/0443 345/173 |
| 2016/0054825 A1* | 2/2016 | Fried | H05K 1/0278 345/173 |
| 2017/0048990 A1* | 2/2017 | Sim | H04M 1/026 |
| 2017/0064826 A1* | 3/2017 | Park | H05K 1/111 |
| 2017/0154842 A1 | 6/2017 | Manusharow et al. | |
| 2018/0232554 A1 | 8/2018 | Benkley et al. | |
| 2019/0011754 A1* | 1/2019 | Chen | G02F 1/133528 |
| 2019/0204669 A1* | 7/2019 | Lee | H01L 23/498 |
| 2019/0369761 A1 | 12/2019 | Guard et al. | |
| 2020/0142542 A1* | 5/2020 | Kuriki | G06F 3/044 |

FOREIGN PATENT DOCUMENTS

| | | |
|---|---|---|
| JP | 2003-248441 A | 9/2003 |
| KR | 10-2004-0048695 A | 6/2004 |
| KR | 10-2008-0046371 A | 5/2008 |
| KR | 10-2012-0131876 A | 12/2012 |
| KR | 10-2018-0077625 A | 7/2018 |

\* cited by examiner

TRACE TRANSFER TECHNIQUES FOR TOUCH SENSOR PANELS WITH FLEX CIRCUITS

CROSS REFERENCE TO RELATED APPLICATIONS

This application claims the benefit under 35 U.S.C. 119(e) of U.S. Provisional Patent Application No. 62/754,558, filed Nov. 1, 2018, U.S. Provisional Patent Application No. 62/812,172, filed Feb. 28, 2019, U.S. Provisional Patent Application No. 62/872,054, filed Jul. 9, 2019, the contents of which are incorporated herein by reference in their entirety for all purposes.

FIELD OF THE DISCLOSURE

This relates generally to touch sensitive devices and, more specifically, to touch sensitive devices including flex circuits that use trace transfer techniques.

BACKGROUND OF THE DISCLOSURE

Many types of input devices are presently available for performing operations in a computing system, such as buttons or keys, mice, trackballs, joysticks, touch sensor panels, touch screens and the like. Touch screens, in particular, are popular because of their ease and versatility of operation as well as their declining price. Touch screens can include a touch sensor panel, which can be a clear panel with a touch-sensitive surface, and a display device such as a liquid crystal display (LCD), light emitting diode (LED) display or organic light emitting diode (OLED) display that can be positioned partially or fully behind the panel so that the touch-sensitive surface can cover at least a portion of the viewable area of the display device. Touch screens can allow a user to perform various functions by touching the touch sensor panel using a finger, stylus or other object at a location often dictated by a user interface (UI) being displayed by the display device. In general, touch screens can recognize a touch and the position of the touch on the touch sensor panel, and the computing system can then interpret the touch in accordance with the display appearing at the time of the touch, and thereafter can perform one or more actions based on the touch. In the case of some touch sensing systems, a physical touch on the display is not needed to detect a touch. For example, in some capacitive-type touch sensing systems, fringing electrical fields used to detect touch can extend beyond the surface of the display, and objects approaching near the surface may be detected near the surface without actually touching the surface.

Capacitive touch sensor panels can be formed by a matrix of partially or fully transparent or non-transparent conductive plates (e.g., touch electrodes) made of materials such as Indium Tin Oxide (ITO). In some examples, the conductive plates can be formed from other materials including conductive polymers, metal mesh, graphene, nanowires (e.g., silver nanowires) or nanotubes (e.g., carbon nanotubes). It is due in part to their substantial transparency that some capacitive touch sensor panels can be overlaid on a display to form a touch screen, as described above. Some touch screens can be formed by at least partially integrating touch sensing circuitry into a display pixel stack-up (i.e., the stacked material layers forming the display pixels).

BRIEF SUMMARY OF THE DISCLOSURE

This relates generally to touch sensitive devices and, more specifically, to touch sensitive devices including flex circuits that use trace transfer techniques. One or more touch electrodes on a first side of the substrate can be routed to a bond pad region on the second side of the substrate via a trace transfer technique. For example, one or more conductive traces can wrap around one or more edges of the substrate from the first side to the second side. One or more touch electrodes on the second side of the substrate can also be routed to the bond pad region on the second side of the substrate. The touch sensor panel can further include a flex circuit that couples to the bond pad region to connect the touch electrodes on the first side of the substrate and the touch electrodes on the second side of the substrate to touch circuitry (e.g., on a separate printed circuit board (PCB)).

In some examples, trace transfer techniques can be used to connect conductive traces (e.g., conductive traces coupled to one or more touch sensor electrodes of a touch sensor panel) to a flex circuit oriented perpendicular to or otherwise not parallel to the touch surface of the touch sensor panel. Orienting the flex circuit in this way can enable the flex circuit to connect to touch circuitry with reduced bending as compared with the amount of bending of the flex circuit when oriented substantially parallel to the substrate (e.g., bending 90 degrees as opposed to 180 degrees).

In some examples, one or more of the bond pads described herein can include a conductive material (e.g., copper) separated from an edge of the substrate by threshold distance. In some examples, one or more of the bond pads described herein can including a conductive material (e.g., copper) including a tail portion that extends to the edge of the substrate. The width of the tail portion can be narrower than remaining portion of the bond pad. In some examples, the thickness and/or width of the conductive traces can be increased near edges of the substrate to provide increased structural stability.

DETAILED DESCRIPTION OF THE DISCLOSURE

In the following description of examples, reference is made to the accompanying drawings which form a part hereof, and in which it is shown by way of illustration specific examples that can be practiced. It is to be understood that other examples can be used and structural changes can be made without departing from the scope of the disclosed examples.

This relates to touch sensor panels with a single-side bonding to couple touch electrodes on each side of a substrate of the touch sensor panel to touch sensing circuitry. In some examples, a double-sided touch sensor panel can include touch electrodes on two sides of the substrate. One or more touch electrodes on a first side of the substrate can be routed to a bond pad region on the second side of the substrate via a trace transfer technique. For example, one or more conductive traces can wrap around one or more edges of the substrate from the first side to the second side. One or more touch electrodes on the second side of the substrate can also be routed to the bond pad region on the second side of the substrate. The touch sensor panel can further include a flex circuit that couples to the bond pad region to connect the touch electrodes on the first side of the substrate and the touch electrodes on the second side of the substrate to touch circuitry (e.g., on a separate printed circuit board (PCB)). In some examples, the trace transfer techniques can be used for a single-sided touch sensor panel to route touch electrodes on a first side of the substrate to a bond pad on the second side of the substrate.

In some examples, trace transfer techniques can be used to connect conductive traces (e.g., conductive traces coupled to one or more touch sensor electrodes of a touch sensor panel) to a flex circuit oriented perpendicular to or otherwise not parallel to the touch surface of the touch sensor panel. Orienting the flex circuit in this way can enable the flex circuit to connect to touch circuitry with reduced bending as compared with the amount of bending of the flex circuit when oriented substantially parallel to the substrate (e.g., bending 90 degrees as opposed to 180 degrees).

In some examples, one or more of the bond pads described herein can include a conductive material (e.g., copper) separated from an edge of the substrate by threshold distance. In some examples, one or more of the bond pads described herein can including a conductive material (e.g., copper) including a tail portion that extends to the edge of the substrate. The width of the tail portion can be narrower than remaining portion of the bond pad. In some examples, the thickness and/or width of the conductive traces can be increased near edges of the substrate to provide increased structural stability.

Figure 1A:
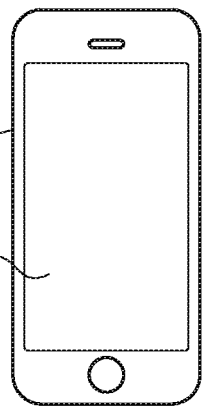
FIGS. 1A-1E illustrate example systems that can use trace transfer techniques according to examples of the disclosure.
Figure 1B:
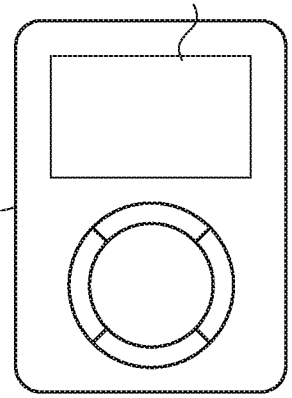
Figure 1C:
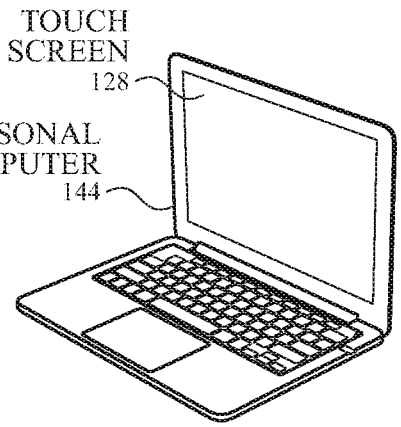
Figure 1D:
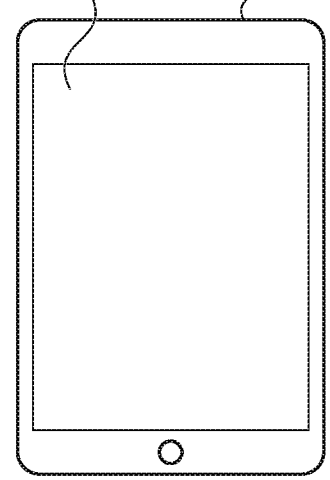
Figure 1E:
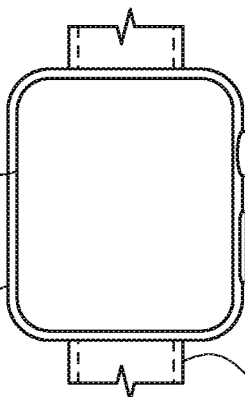

FIGS. 1A-1E illustrate example systems that can use trace transfer techniques according to examples of the disclosure. FIG. 1A illustrates an example mobile telephone 136 that includes a touch screen 124 that can use trace transfer techniques according to examples of the disclosure. FIG. 1B illustrates an example digital media player 140 that includes a touch screen 126 that can use trace transfer techniques according to examples of the disclosure. FIG. 1C illustrates an example personal computer 144 that includes a touch screen 128 that can use trace transfer techniques according to examples of the disclosure. FIG. 1D illustrates an example tablet computing device 148 that includes a touch screen 130 that can use trace transfer techniques according to examples of the disclosure. FIG. 1E illustrates an example wearable device 150 that includes a touch screen 132 and can be attached to a user using a strap 152 and that can use trace transfer techniques according to examples of the disclosure. It is understood that a touch screen and trace transfer techniques can be implemented in other devices as well. Additionally it should be understood that although the disclosure herein primarily focuses on touch screens, the disclosure of trace transfer techniques can be implemented for devices including touch sensor panels (and displays) that may not be implemented as a touch screen.

In some examples, touch screens 124, 126, 128, 130 and 132 can be can be based on self-capacitance. A self-capacitance based touch system can include a matrix of small, individual plates of conductive material or groups of individual plates of conductive material forming larger conductive regions that can be referred to as touch electrodes or as touch node electrodes (as described below with reference to FIG. 4B). For example, a touch screen can include a plurality of individual touch electrodes, each touch electrode identifying or representing a unique location (e.g., a touch node) on the touch screen at which touch or proximity is to be sensed, and each touch node electrode being electrically isolated from the other touch node electrodes in the touch screen/panel. Such a touch screen can be referred to as a pixelated self-capacitance touch screen, though it is understood that in some examples, the touch node electrodes on the touch screen can be used to perform scans other than self-capacitance scans on the touch screen (e.g., mutual capacitance scans). During operation, a touch node electrode can be stimulated with an alternating current (AC) waveform, and the self-capacitance to ground of the touch node electrode can be measured. As an object approaches the touch node electrode, the self-capacitance to ground of the touch node electrode can change (e.g., increase). This change in the self-capacitance of the touch node electrode can be detected and measured by the touch sensing system to determine the positions of multiple objects when they touch, or come in proximity to, the touch screen. In some examples, the touch node electrodes of a self-capacitance based touch system can be formed from rows and columns of conductive material, and changes in the self-capacitance to ground of the rows and columns can be detected, similar to above. In some examples, a touch screen can be multi-touch, single touch, projection scan, full-imaging multi-touch, capacitive touch, etc.

In some examples, touch screens 124, 126, 128, 130 and 132 can be based on mutual capacitance. A mutual capacitance based touch system can include electrodes arranged as drive and sense lines that may cross over each other on different layers (in a double-sided configuration), or may be adjacent to each other on the same layer (e.g., as described below with reference to FIG. 4A). The crossing or adjacent locations can form touch nodes. During operation, the drive line can be stimulated with an AC waveform and the mutual capacitance of the touch node can be measured. As an object approaches the touch node, the mutual capacitance of the touch node can change (e.g., increase). This change in the mutual capacitance of the touch node can be detected and measured by the touch sensing system to determine the positions of multiple objects when they touch, or come in proximity to, the touch screen. As described herein, in some examples, a mutual capacitance based touch system can form touch nodes from a matrix of small, individual plates of conductive material.

In some examples, touch screens 124, 126, 128, 130 and 132 can be based on mutual capacitance and/or self-capacitance. The electrodes can be arrange as a matrix of small, individual plates of conductive material (e.g., as in touch node electrodes 408 in touch screen 402 in FIG. 4B) or as drive lines and sense lines (e.g., as in row touch electrodes 404 and column touch electrodes 406 in touch screen 400 in FIG. 4A), or in another pattern. The electrodes can be configurable for mutual capacitance or self-capacitance sensing or a combination of mutual and self-capacitance sensing. For example, in one mode of operation electrodes can be configured to sense mutual capacitance between electrodes and in a different mode of operation electrodes can be configured to sense self-capacitance of electrodes. In some examples, some of the electrodes can be configured to sense mutual capacitance therebetween and some of the electrodes can be configured to sense self-capacitance thereof.

Figure 2:
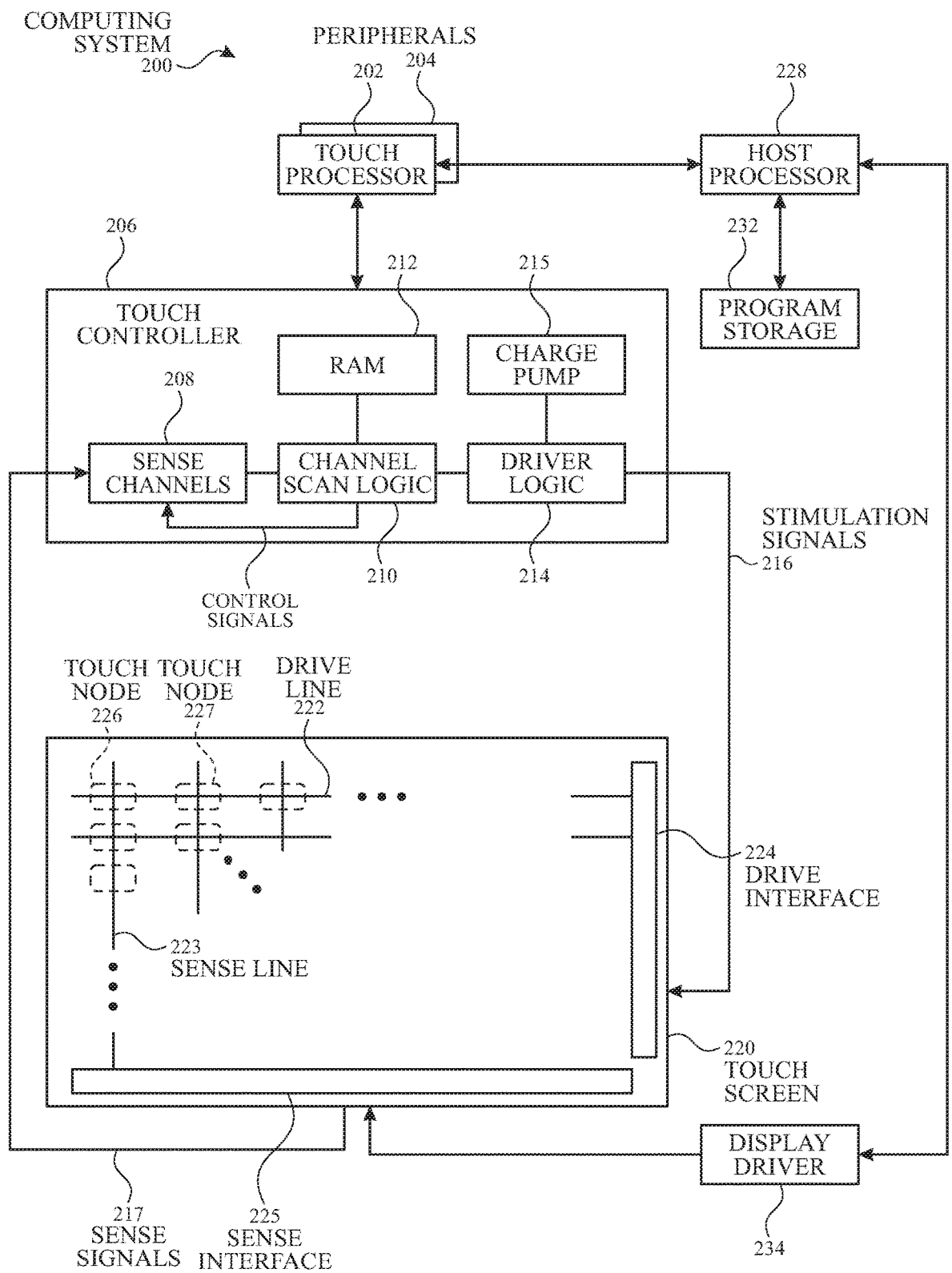
FIG. 2 illustrates an example computing system including a touch screen that can use trace transfer techniques according to examples of the disclosure.

FIG. 2 illustrates an example computing system including a touch screen that can use trace transfer techniques according to examples of the disclosure. Computing system 200 can be included in, for example, a mobile phone, tablet, touchpad, portable or desktop computer, portable media player, wearable device or any mobile or non-mobile computing device that includes a touch screen or touch sensor panel. Computing system 200 can include a touch sensing system including one or more touch processors 202, peripherals 204, a touch controller 206, and touch sensing circuitry (described in more detail below). Peripherals 204 can include, but are not limited to, random access memory (RAM) or other types of memory or storage, watchdog timers and the like. Touch controller 206 can include, but is not limited to, one or more sense channels 208, channel scan logic 210 and driver logic 214. Channel scan logic 210 can access RAM 212, autonomously read data from the sense channels and provide control for the sense channels. In addition, channel scan logic 210 can control driver logic 214 to generate stimulation signals 216 at various frequencies and/or phases that can be selectively applied to drive regions of the touch sensing circuitry of touch screen 220, as described in more detail below. In some examples, touch controller 206, touch processor 202 and peripherals 204 can be integrated into a single application specific integrated circuit (ASIC), and in some examples can be integrated with touch screen 220 itself.

It should be apparent that the architecture shown in FIG. 2 is only one example architecture of computing system 200, and that the system could have more or fewer components than shown, or a different configuration of components. The various components shown in FIG. 2 can be implemented in hardware, software, firmware or any combination thereof, including one or more signal processing and/or application specific integrated circuits.

Computing system 200 can include a host processor 228 for receiving outputs from touch processor 202 and performing actions based on the outputs. For example, host processor 228 can be connected to program storage 232 and a display controller/driver 234 (e.g., a Liquid-Crystal Display (LCD) driver). It is understood that although some examples of the disclosure may described with reference to LCD displays, the scope of the disclosure is not so limited and can extend to other types of displays, such as Light-Emitting Diode (LED) displays, including Organic LED (OLED), Active-Matrix Organic LED (AMOLED) and Passive-Matrix Organic LED (PMOLED) displays. Display driver 234 can provide voltages on select (e.g., gate) lines to each pixel transistor and can provide data signals along data lines to these same transistors to control the pixel display image.

Host processor 228 can use display driver 234 to generate a display image on touch screen 220, such as a display image of a user interface (UI), and can use touch processor 202 and touch controller 206 to detect a touch on or near touch screen 220, such as a touch input to the displayed UI. The touch input can be used by computer programs stored in program storage 232 to perform actions that can include, but are not limited to, moving an object such as a cursor or pointer, scrolling or panning, adjusting control settings, opening a file or document, viewing a menu, making a selection, executing instructions, operating a peripheral device connected to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 228 can also perform additional functions that may not be related to touch processing.

Note that one or more of the functions described herein, including the configuration of switches, can be performed by firmware stored in memory (e.g., one of the peripherals 204 in FIG. 2) and executed by touch processor 202, or stored in program storage 232 and executed by host processor 228. The firmware can also be stored and/or transported within any non-transitory computer-readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "non-transitory computer-readable storage medium" can be any medium (excluding signals) that can contain or store the program for use by or in connection with the instruction execution system, apparatus, or device. In some examples, RAM 212 or program storage 232 (or both) can be a non-transitory computer readable storage medium. One or both of RAM 212 and program storage 232 can have stored therein instructions, which when executed by touch processor 202 or host processor 228 or both, can cause the device including computing system 200 to perform one or more functions and methods of one or more examples of this disclosure. The computer-readable storage medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The firmware can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport medium can include, but is not limited to, an electronic, magnetic, optical, electromagnetic or infrared wired or wireless propagation medium.

Touch screen 220 can be used to derive touch information at multiple discrete locations of the touch screen, referred to herein as touch nodes. Touch screen 220 can include touch sensing circuitry that can include a capacitive sensing medium having a plurality of drive lines 222 and a plurality of sense lines 223. It should be noted that the term "lines" is sometimes used herein to mean simply conductive pathways, as one skilled in the art will readily understand, and is not limited to elements that are strictly linear, but includes pathways that change direction, and includes pathways of different size, shape, materials, etc. Drive lines 222 can be driven by stimulation signals 216 from driver logic 214 through a drive interface 224, and resulting sense signals 217 generated in sense lines 223 can be transmitted through a sense interface 225 to sense channels 208 in touch controller 206. In this way, drive lines and sense lines can be part of the touch sensing circuitry that can interact to form capacitive sensing nodes, which can be thought of as touch picture elements (touch pixels) and referred to herein as touch nodes, such as touch nodes 226 and 227. This way of understanding can be particularly useful when touch screen 220 is viewed as capturing an "image" of touch ("touch image"). In other words, after touch controller 206 has determined whether a touch has been detected at each touch nodes in the touch screen, the pattern of touch nodes in the touch screen at which a touch occurred can be thought of as an "image" of touch (e.g., a pattern of fingers touching the touch screen). As used herein, an electrical component "coupled to" or "connected to" another electrical component encompasses a direct or indirect connection providing electrical path for communication or operation between the coupled components. Thus, for example, drive lines 222 may be directly connected to driver logic 214 or indirectly connected to drive logic 214 via drive interface 224 and sense lines 223 may be directly connected to sense channels 208 or indirectly connected to sense channels 208 via sense interface 225. In either case an electrical path for driving and/or sensing the touch nodes can be provided.

Figure 3A:
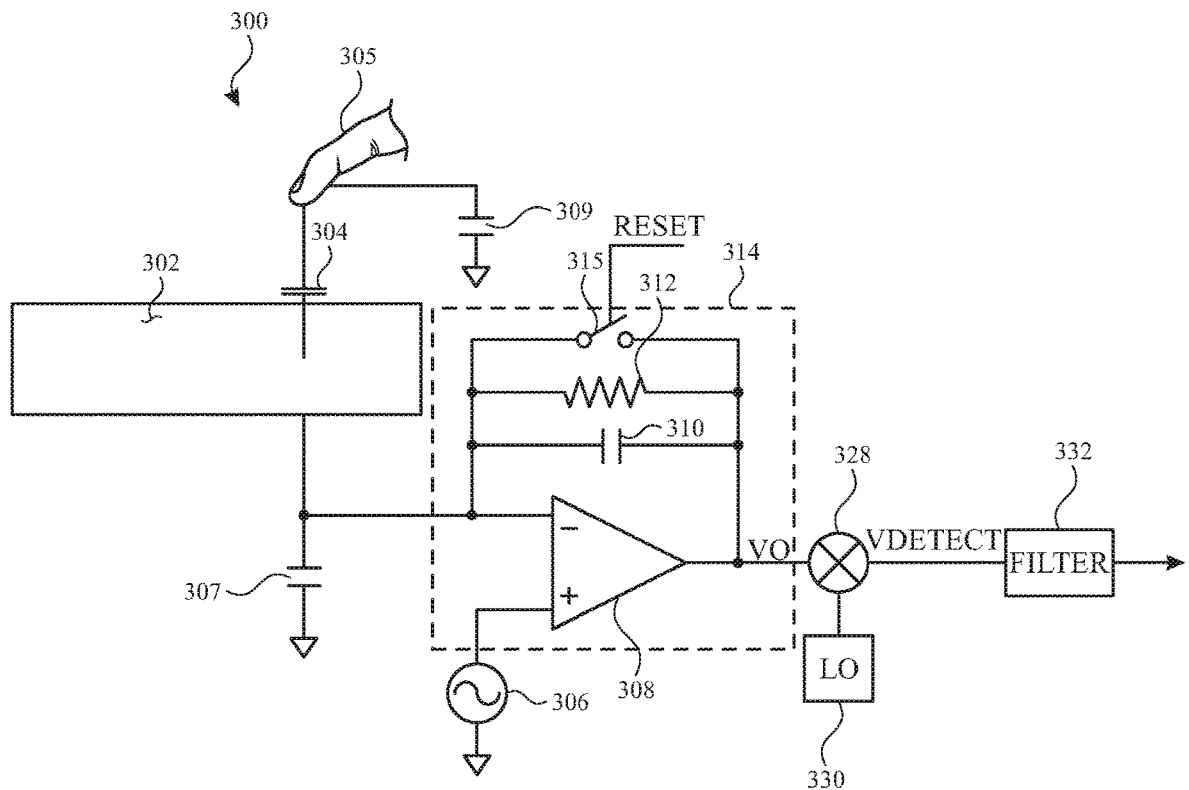
FIG. 3A illustrates an exemplary touch sensor circuit corresponding to a self-capacitance measurement of a touch node electrode and sensing circuit according to examples of the disclosure.

FIG. 3A illustrates an exemplary touch sensor circuit 300 corresponding to a self-capacitance measurement of a touch node electrode 302 and sensing circuit 314 according to examples of the disclosure. Touch node electrode 302 can correspond to a touch electrode 404 or 406 of touch screen 400 or a touch node electrode 408 of touch screen 402. Touch node electrode 302 can have an inherent self-capacitance to ground associated with it, and also an additional self-capacitance to ground that is formed when an object, such as finger 305, is in proximity to or touching the electrode. The total self-capacitance to ground of touch node electrode 302 can be illustrated as capacitance 304. Touch node electrode 302 can be coupled to sensing circuit 314. Sensing circuit 314 can include an operational amplifier 308, feedback resistor 312 and feedback capacitor 310, although other configurations can be employed. For example, feedback resistor 312 can be replaced by a switched capacitor resistor in order to minimize a parasitic capacitance effect that can be caused by a variable feedback resistor. Touch node electrode 302 can be coupled to the inverting input (−) of operational amplifier 308. An AC voltage source 306 (Vac) can be coupled to the non-inverting input (+) of operational amplifier 308. Touch sensor circuit 300 can be configured to sense changes (e.g., increases) in the total self-capacitance 304 of the touch node electrode 302 induced by a finger or object either touching or in proximity to the touch sensor panel. Output 320 can be used by a processor to determine the presence of a proximity or touch event, or the output can be inputted into a discrete logic network to determine the presence of a proximity or touch event.

Figure 3B:
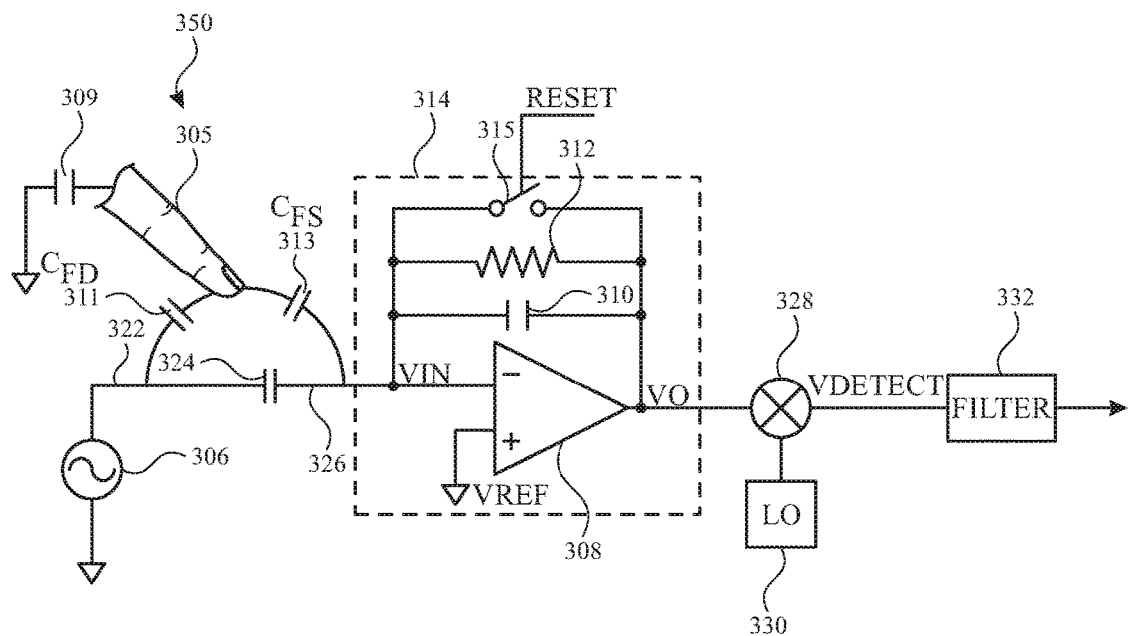
FIG. 3B illustrates an exemplary touch sensor circuit corresponding to a mutual-capacitance drive line and sense line and sensing circuit according to examples of the disclosure.

FIG. 3B illustrates an exemplary touch sensor circuit 350 corresponding to a mutual-capacitance drive line 322 and sense line 326 and sensing circuit 314 according to examples of the disclosure. Drive line 322 can be stimulated by stimulation signal 306 (e.g., an AC voltage signal). Stimulation signal 306 can be capacitively coupled to sense line 326 through mutual capacitance 324 between drive line 322 and the sense line. When a finger or object 305 approaches the touch node created by the intersection of drive line 322 and sense line 326, mutual capacitance 324 can change (e.g., decrease). This change in mutual capacitance 324 can be detected to indicate a touch or proximity event at the touch node, as described herein. The sense signal coupled onto sense line 326 can be received by sensing circuit 314. Sensing circuit 314 can include operational amplifier 308 and at least one of a feedback resistor 312 and a feedback capacitor 310. FIG. 3B illustrates a general case in which both resistive and capacitive feedback elements are utilized. The sense signal (referred to as $V_{in}$) can be inputted into the inverting input of operational amplifier 308, and the non-inverting input of the operational amplifier can be coupled to a reference voltage $V_{ref}$. Operational amplifier 308 can drive its output to voltage $V_o$ to keep $V_{in}$ substantially equal to $V_{ref}$, and can therefore maintain $V_{in}$ constant or virtually grounded. A person of skill in the art would understand that in this context, equal can include deviations of up to 15%. Therefore, the gain of sensing circuit 314 can be mostly a function of the ratio of mutual capacitance 324 and the feedback impedance, comprised of resistor 312 and/or capacitor 310. The output of sensing circuit 314 Vo can be filtered and heterodyned or homodyned by being fed into multiplier 328, where Vo can be multiplied with local oscillator 330 to produce $V_{detect}$. $V_{detect}$ can be inputted into filter 332. One skilled in the art will recognize that the placement of filter 332 can be varied; thus, the filter can be placed after multiplier 328, as illustrated, or two filters can be employed: one before the multiplier and one after the multiplier. In some examples, there can be no filter at all. The direct current (DC) portion of $V_{detect}$ can be used to determine if a touch or proximity event has occurred.

Referring back to FIG. 2, in some examples, touch screen 220 can be an integrated touch screen in which touch sensing circuit elements of the touch sensing system can be integrated into the display pixel stack-ups of a display. The circuit elements in touch screen 220 can include, for example, elements that can exist in LCD or other displays (LED display, OLED display, etc.), such as one or more pixel transistors (e.g., thin film transistors (TFTs)), gate lines, data lines, pixel electrodes and common electrodes. In a given display pixel, a voltage between a pixel electrode and a common electrode can control a luminance of the display pixel. The voltage on the pixel electrode can be supplied by a data line through a pixel transistor, which can be controlled by a gate line. It is noted that circuit elements are not limited to whole circuit components, such as a whole capacitor, a whole transistor, etc., but can include portions of circuitry, such as only one of the two plates of a parallel plate capacitor.

Figure 4B:
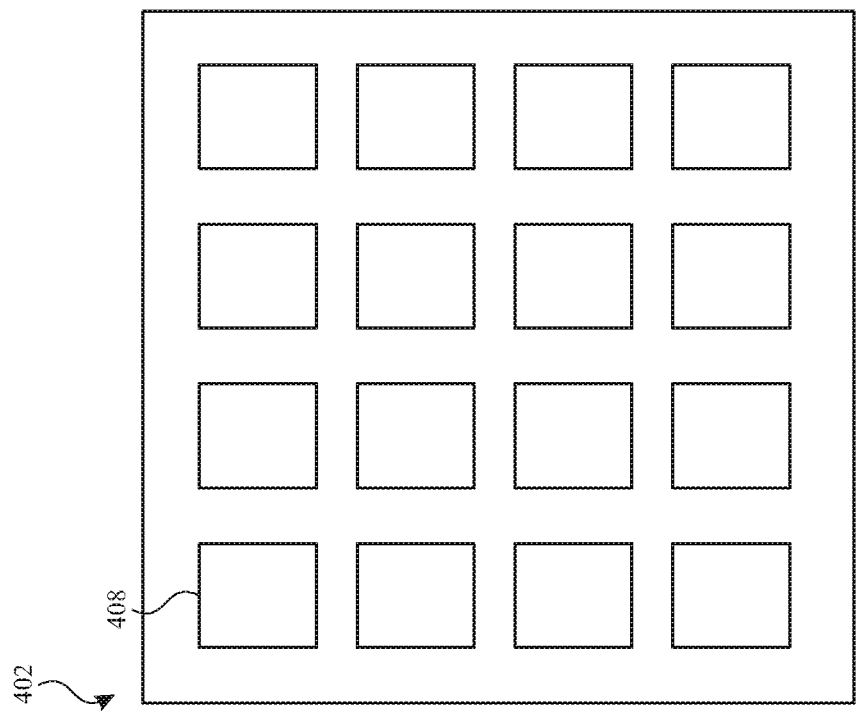
FIG. 4B illustrates touch screen with touch node electrodes arranged in a pixelated touch node electrode configuration according to examples of the disclosure.
Figure 4A:
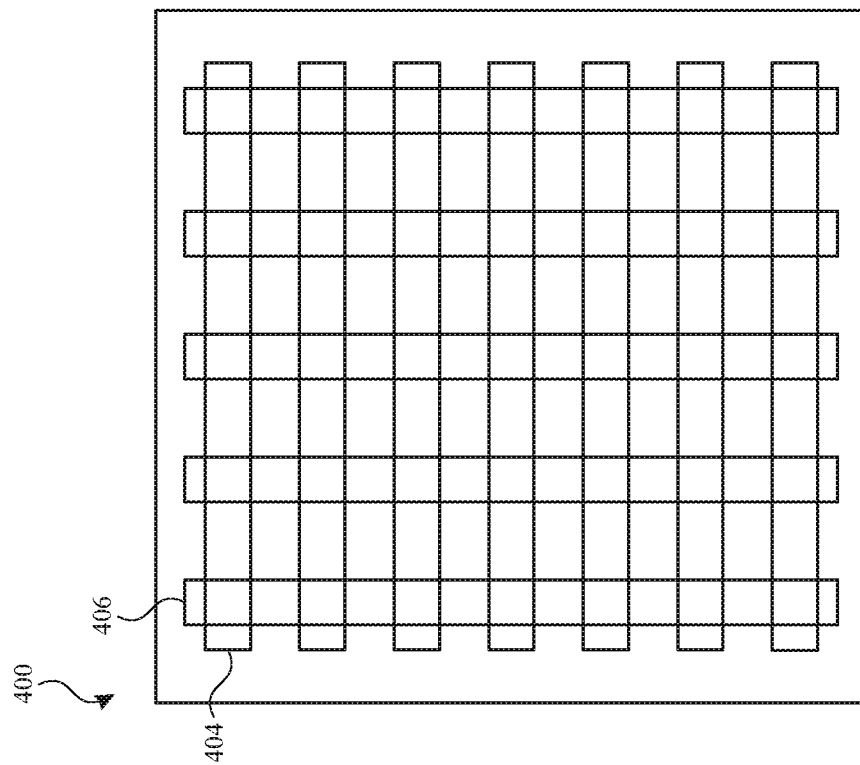
FIG. 4A illustrates touch screen with touch electrodes arranged in rows and columns according to examples of the disclosure.

FIG. 4A illustrates touch screen 400 with touch electrodes 404 and 406 arranged in rows and columns according to examples of the disclosure. Specifically, touch screen 400 can include a plurality of touch electrodes 404 disposed as rows, and a plurality of touch electrodes 406 disposed as columns. Touch electrodes 404 and touch electrodes 406 can be on the same or different material layers on touch screen 400, and can intersect with each other, as illustrated in FIG. 4A. In some examples, the electrodes can be formed on opposite sides of a transparent (partially or fully) substrate and from a transparent (partially or fully) semiconductor material, such as ITO, though other materials are possible. Electrodes displayed on layers on different sides of the substrate can be referred to herein as a double-sided sensor. In some examples, touch screen 400 can sense the self-capacitance of touch electrodes 404 and 406 to detect touch and/or proximity activity on touch screen 400, and in some examples, touch screen 400 can sense the mutual capacitance between touch electrodes 404 and 406 to detect touch and/or proximity activity on touch screen 400.

FIG. 4B illustrates touch screen 402 with touch node electrodes 408 arranged in a pixelated touch node electrode configuration according to examples of the disclosure. Specifically, touch screen 402 can include a plurality of individual touch node electrodes 408, each touch node electrode identifying or representing a unique location on the touch screen at which touch or proximity (i.e., a touch or proximity event) is to be sensed, and each touch node electrode being electrically isolated from the other touch node electrodes in the touch screen/panel, as previously described. Touch node electrodes 408 can be on the same or different material layers on touch screen 402. In some examples, touch screen 402 can sense the self-capacitance of touch node electrodes 408 to detect touch and/or proximity activity on touch screen 402, and in some examples, touch screen 402 can sense the mutual capacitance between touch node electrodes 408 to detect touch and/or proximity activity on touch screen 402.

Figure 5:
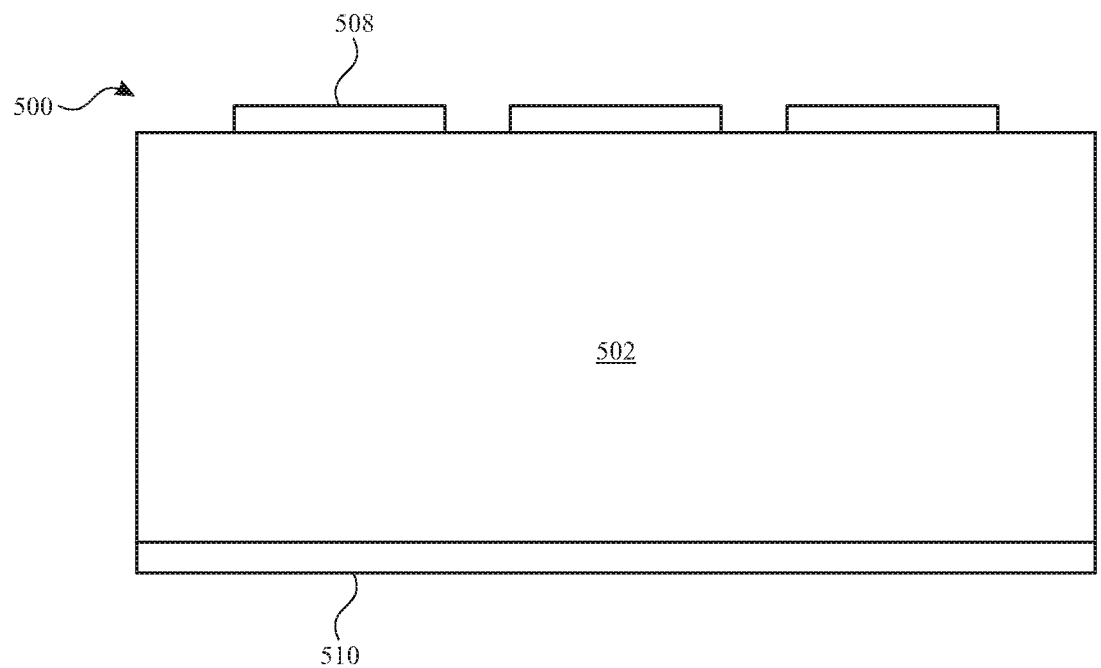
FIG. 5 illustrates a cross-section of a touch sensor panel implemented as a double-sided touch sensor panel according to examples of the disclosure.

FIG. 5 illustrates a cross-section of a touch sensor panel 500 implemented as a double-sided touch sensor panel according to examples of the disclosure. Touch sensor panel 500 can include touch electrodes 508 on a first side of a substrate 502 (e.g., top side) arranged in a column pattern and touch electrodes 510 on a second side of a substrate 502 (opposite the first side) arranged in a row pattern. The arrangement of touch sensor panel 500 can correspond to a double-sided implementation of touch electrodes shown in FIG. 4A, although other shapes and arrangements of electrodes are possible. Substrate 502 can include a supportive insulating material that is also, in some examples, fully or partially transparent. In some examples, the substrate can be formed from cyclic olefin polymer (COP). In some examples, the substrate 502 can include one or more substrate materials adhered together with an adhesive. In some embodiments, the electrodes can include a fully or partially transparent conductive material, such as indium-tin oxide (ITO).

Figure 6A:
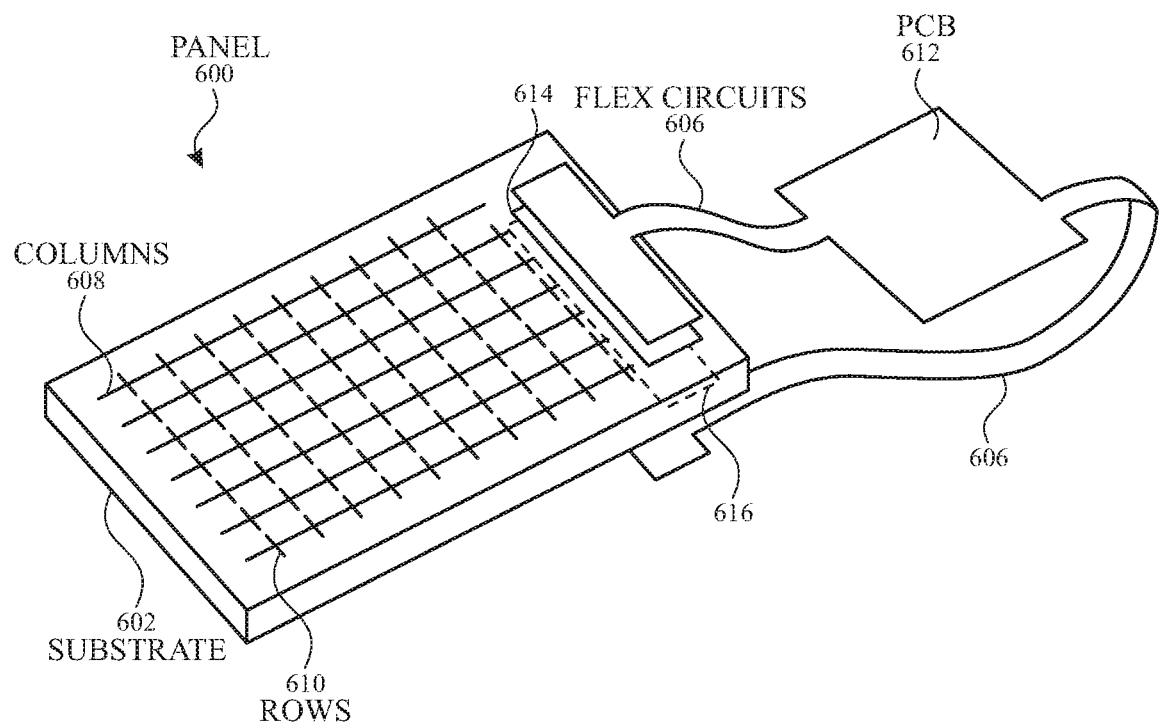
FIGS. 6A-6D illustrate an exemplary touch sensor panel including bond pads and flex circuit connections on both sides of a substrate according to some examples of the disclosure.

Touch electrodes on a double-sided touch sensor panel, such as touch sensor panel 500, can be coupled to touch sensing circuitry (e.g., touch controller 206), via flex circuits. Flex circuits can formed from a flexible insulating material, such as polyethylene terephthalate (PET), with conductive material (e.g., routing traces) disposed in the flexible insulating material. The flex circuits can be bonded to a substrate of the touch screen (e.g., via a bond pad region). FIGS. 6A-6D illustrate an exemplary touch sensor panel 600 including bond pads and flex circuit connections on both sides of a substrate according to some examples of the disclosure. FIG. 6A illustrates a view of a double-sided touch sensor panel 600 (e.g., corresponding to touch sensor panel 500) including a bond pad region and flex circuit on each of two opposite sides of a substrate according to some examples of the disclosure. The touch sensor panel 600 can include substrate 602 with touch electrodes (e.g., column electrodes 608) patterned on a first side (e.g., top side) and touch electrodes (e.g., row electrodes 610) patterned on a second side opposite the first side (e.g., bottom side). Additionally, touch sensor panel 600 can include a first bond pad region 614 on the first side of substrate 602 and a second bond pad region 616 on the second side of substrate 602. Touch electrodes of touch sensor panel 600 can be routed to the bond pad region and coupled to touch sensing circuitry (e.g., touch controller 206) including sense circuitry (e.g., corresponding to sense channels 208) and drive circuitry (e.g., corresponding to driver logic 214) on PCB 612 via flex circuits. For example, a first flex circuit 606 can be coupled to a first bond pad region 614 on a first side of substrate 602 and a second flex circuit 606 can be coupled to a second bond pad region 616 on a second side of substrate 602. In some examples, the coupling between a bond pad region 614, 616 and corresponding flex circuit 606 can be achieved using a conductive adhesive 604, as described below with reference to FIGS. 6B-6C, for example. For example, an anisotropic conductive film (ACF) can be deposited on the bond pad region and/or the flex circuit and an electrical connection can be formed by laminating the two together. Although one bond pad region and one flex circuit are illustrated on each side of substrate 602, it should be understood that one or more bond pad regions and flex circuits could be implemented on each side of substrate 602.

Figure 6B:
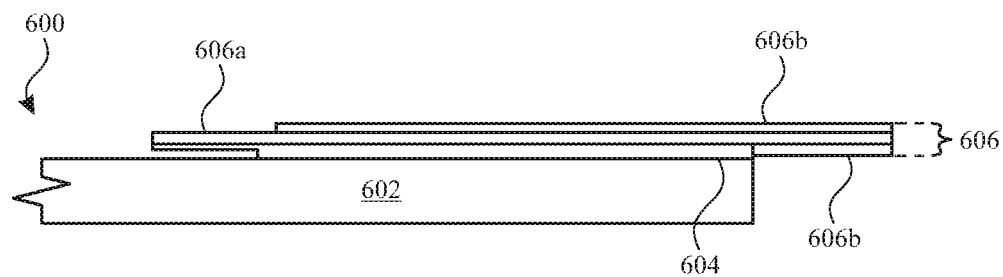
Figure 6C:
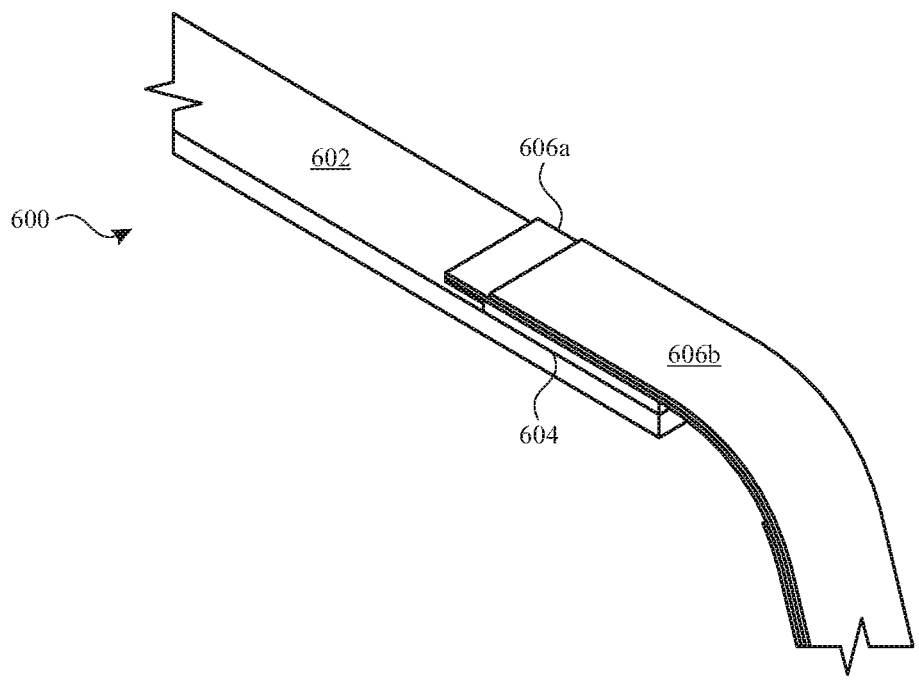

FIGS. 6B-6C illustrate cross-sectional views of touch sensor panel 600 at a location including the connection between one bond pad region (e.g., corresponding to bond pad region 614 or 616) and one flex circuit 606. The touch sensor panel 600 can include a substrate 602 upon which touch electrodes can be patterned on a first side and a second side (opposite the first side). For simplicity of illustration, the touch electrodes are not shown in FIGS. 6B-6C. Touch sensor panel 600 can include a conductive adhesive 604 (e.g., an anisotropic conductive film (ACF)), and a flex circuit 606. Flex circuit 606 can include conductive material 606a (e.g., routing traces) surrounded by an insulating material 606b. The insulating material 606b of FIGS. 6B-6C is shown on top and bottom of the conductive material 606a, but it should be understood that insulating material can also separate between the routing traces formed from conductive material 606a. In some examples, the conductive material can be copper wire or traces and the insulating material can be PET. Flex circuit 606 can be bonded to substrate 602 at a bond pad region via the conductive adhesive, for example. The bond pad region can, in some examples, include one or more bond pads. Each of the one or more bond pads can be coupled to a touch electrode (e.g., via routing traces). In some examples, the bond pad and/or routing traces can be formed of the same material as the touch electrodes (e.g., ITO). In some examples, the bond pad and/or routing traces can be formed of a different material (e.g., copper). The conductive adhesive 604 can be disposed over the bond pads and/or over the conductive material 606a of the flex circuit 606 for robust mechanical and electrical connection. As shown in FIG. 6C, in some examples, flex circuit 606 can be flexible to enable the touch electrodes (e.g., column electrodes 608 or row electrodes 610) on both sides of the substrate 602 to be electrically coupled to sensing circuitry in another part of the system. For example, the touch controller (including drive and sense circuitry) may be implemented on a printed circuit board (e.g., PCB 612) separately from the double-sided touch sensor panel. In some examples, the printed circuit board (e.g., PCB 612) can be disposed beneath the display/touch screen or in a border region so as not to obscure the display and/or interfere with touch sensing. The flex circuit 606 enables bending of the routing traces between the touch sensor panel substrate 602 and the printed circuit board (e.g., PCB 612) with the corresponding touch sensing circuitry.

Figure 6D:
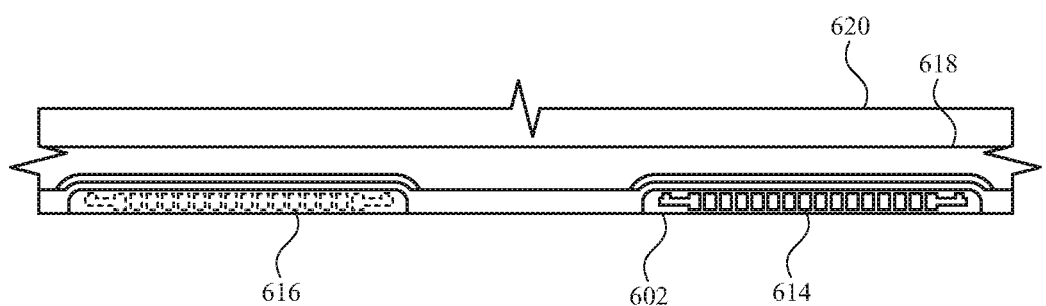

Returning back to FIG. 6A, although first bond pad region 614 and second bond pad region 616 are illustrated in the same region (overlapping one another) but on different sides of the substrate 602, in some examples, the bond pad regions can be adjacent to each other and/or spaced from one another, as illustrated in FIG. 6D. FIG. 6D illustrates a partial top view of the border region of a touch sensor panel 600 that includes first bond pad region 614 and second bond pad region 616. An opaque mask 618 can differentiate between the touch and display region 620 of substrate 602 (e.g., an inner region of the electronic device that includes a touch screen) and a border region of substrate 602 (e.g., an outer region of the substrate that does not display an image and/or does not sense touch) that may not be visible outside the housing of a touch-sensitive device. The border region can include bond pad regions 614 and 616, one on the top side and one on the bottom side, as described with reference to FIG. 6A. Each bond pad region 614 or 616 can include one or more bond pads that couple one or more touch electrode (e.g., column electrodes 608 or row electrodes 610) to a corresponding one of the flex circuits (e.g., one flex circuit 606 on the top of substrate 602 and one flex circuit 606 on the bottom of substrate 602).

As described above with reference to FIGS. 6A-6D, bond pad regions 614 and 616 can facilitate the connection of touch electrodes to a PCB 612 (including touch sensing circuitry) via flex circuits 606. In some examples, however, it can be desirable to connect the touch electrodes of a double-sided touch sensor panel on a single side of the touch sensor panel substrate and to one bond pad region. For example, trace transfer techniques can be used to form and/or connect bond pad regions formed on one side of the substrate (e.g., a second, bottom side of a substrate) by way of a conductive connection wrapping from the first side of the substrate around edges of the substrate to the second side of the substrate (e.g., around a first edge defining a boundary of the first side of the substrate, around a third side of the substrate between the first side and the second side, and around a second edge defining a boundary of the second side). In some examples, the conductive connections can be formed by applying aerosolized conductive material (e.g., silver or other suitable conductive materials), which can be applied at relatively low temperatures, thereby protecting the other components of the touch sensor panel during manufacture. In some examples, trace transfer techniques can enable single-sided bonding of touch electrodes from both sides (top and bottom) of the double-sided touch sensor panel to be coupled to a single flex circuit, as will be described below with reference to FIGS. 7A-H. A single-sided flex circuit connection can increase manufacturing yield, provide a more robust connection structure (damage-resistant), and shrink the border region (enabling the touch screen to occupy more of the device surface) as compared with the double-sided bonding of multiple flex circuits.

Figure 7A:
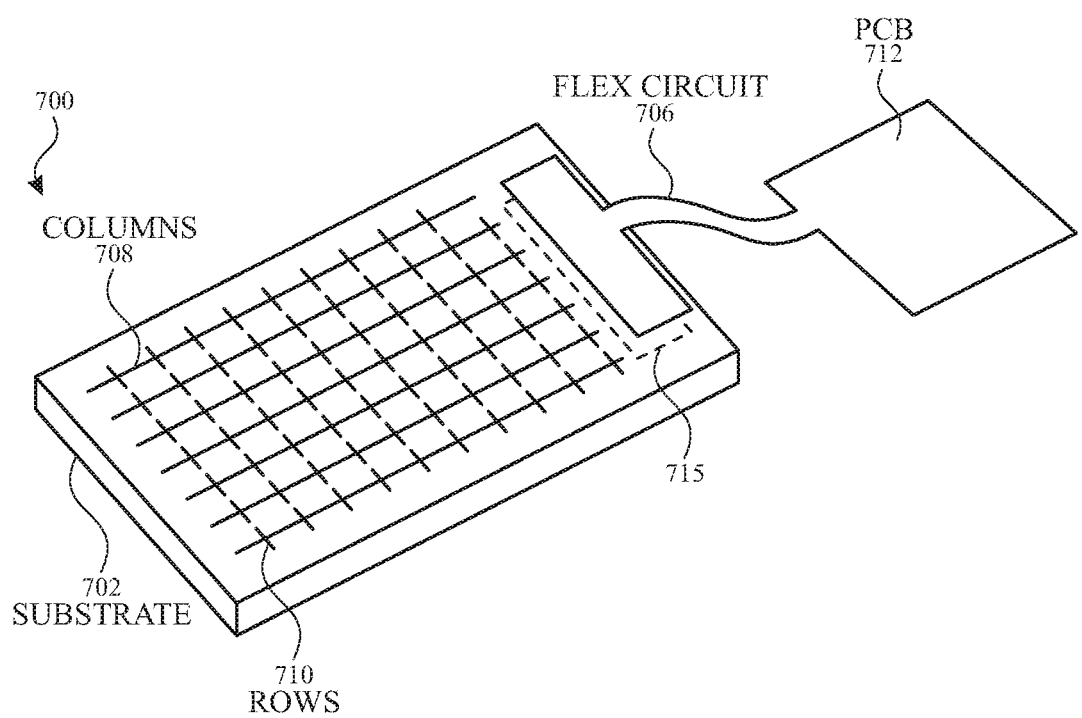
FIGS. 7A-7H illustrate an exemplary touch sensor panel including a flex circuit connection on one side of a substrate according to some examples of the disclosure.

FIGS. 7A-7H illustrate an exemplary touch sensor panel 700 including a flex circuit connection on one side of a substrate according to some examples of the disclosure. FIG. 7A illustrates a view of a double-sided touch sensor panel 700 (e.g., corresponding to touch sensor panel 500) including a bond pad region 715 and flex circuit 706 on one side of a substrate 702 according to some examples of the disclosure. Touch sensor panel 700 can be similar to touch sensor panel 600 described above (e.g., with reference to FIG. 6A), except touch sensor panel 600 includes bond pad regions 614 and 616 on each side of substrate 602 coupled to two flex circuits 606 (one per side of substrate 602), whereas touch sensor panel 700 includes bond pad region 715 on one side of substrate 702 coupled to one flex circuit 706. As will be described below with reference to FIGS. 7B-H, the bond pad region 715 on one side of substrate 702 includes connections between touch electrodes (e.g., column electrodes 708) disposed on a first side (e.g., the top) of the substrate 702 and PCB 712 and connections between touch electrodes (e.g., row electrodes 710) disposed on a second side (e.g., the bottom) of the substrate 702 and PCB 712.

In some examples, the coupling between touch electrodes on the first side of the substrate 702 and the bond pad region 715, which can be on the second side of the substrate 702 can be facilitated by trace transfer with a conductive trace, as will be described in more detail below. For example, a layer of copper, silver, or some other suitable conductive material can be deposited around edges of substrate 702 such that it wraps around the substrate 702 from the first side to the second side to connect the touch electrodes to the bond pad region 715 (e.g., via a third side, illustrated as the right side in FIG. 7B). The bond pad region 715 can include electrical connections to the touch sensing circuitry using a flex circuit. Further, in some examples, the coupling between a bond pad region 715 and the flex circuit 706 can be achieved using a conductive adhesive 704 similar to conductive adhesive 604, for example. For example, an anisotropic conductive film can be deposited on the bond pad region and/or the flex circuit and an electrical connection can be formed by laminating the two together.

Figure 7B:
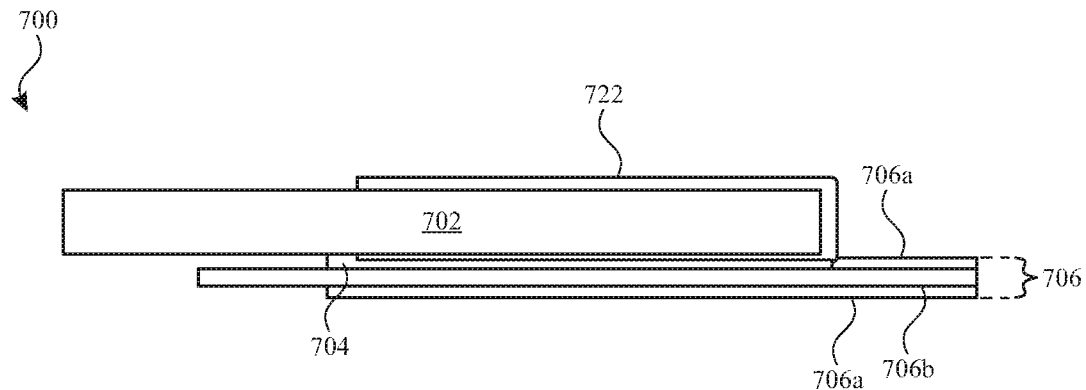
Figure 7C:
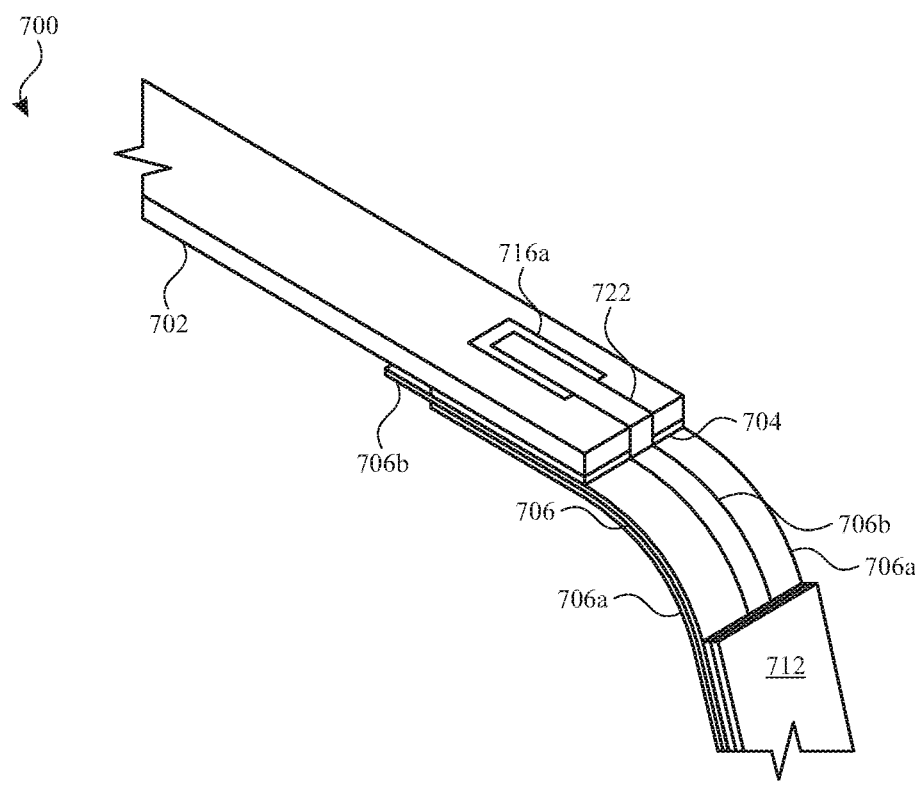

FIGS. 7B-7C illustrate cross-sectional views of touch sensor panel 700 at a location including the connection between a bond pad region 715 and a flex circuit 706. The touch sensor panel 700 can include one or more components that are included in touch sensor panel 600, such as substrate 702, flex circuit 706 (including a conductive portion 706b and an insulting portion 706a), and conductive adhesive 704. Similar to FIGS. 6B-6C, the touch electrodes are not shown in FIGS. 7B-7C for ease of illustration.

Touch sensor panel 700 can further include one or more conductive traces 722 that wrap around substrate 702 to transfer the one or more touch electrodes disposed on the first side of the substrate to the second side of the substrate. As shown in FIGS. 7B-7C for conductive traces 722 can wrap around from the first side (e.g., the top side) of the substrate to the second side (e.g., the bottom side) of the substrate via a third side of the substrate (e.g., the right side illustrated in FIG. 7B for example). The third side of the substrate can be between the first side of the substrate and the second side of the substrate (e.g., orthogonal to the first and second sides). A first edge (e.g., top edge) of the first side of the substrate can define a first boundary between the first side of the substrate and the third side of the substrate. A second edge (e.g., bottom edge) of the second side of the substrate can define a second boundary between the second side of the substrate and the third side of the substrate. As shown in FIGS. 7B-7C, flex circuit 706 can be coupled to the second side (e.g., the bottom side) of the substrate 702. Thus, in some examples, the conductive trace(s) 722 can be used to couple one or more touch electrodes (e.g., column electrodes 708 illustrated in FIG. 7A) on the first side of the substrate 702 to the second side of the substrate for single-sided bonding with the flex circuit 706 on the second side of the substrate.

The bond pad region 715 of touch sensor panel 700 can include one or more bond pads, for example. Each of the one or more bond pads can be coupled to a touch electrode (e.g., via routing traces on the second side or via trace transfer from the first side). In some examples, bond pad region 715 can include bond pads that couple to touch electrodes on the first side of the substrate 702 and bond pads that couple to touch electrodes on the second side of the substrate 702. In some examples, the bond pad and/or routing traces can be formed of the same material as the touch electrodes (e.g., ITO). In some examples, the bond pad and/or routing traces can be formed of a different material (e.g., copper). The conductive adhesive 704 can be disposed over the bond pads and/or over the conductive material 706b of the flex circuit 706 for robust mechanical and electrical connection to circuitry, such as touch circuitry (e.g., touch controller 206) disposed on a printed circuit board 712. In some examples, the printed circuit board 712 can be disposed beneath the display/touch screen or in a border region so as not to obscure the display and/or interfere with touch sensing. The flex circuit 706 enables bending of the routing traces between the touch sensor panel substrate 702 and the printed circuit board 712 with the corresponding touch sensing circuitry.

Figure 7D:
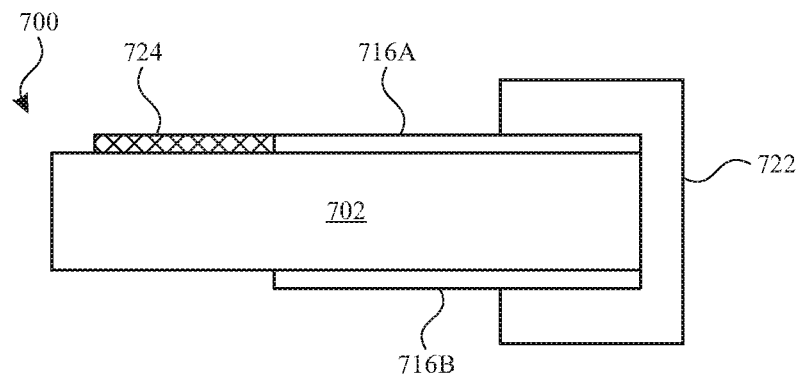
Figure 7E:
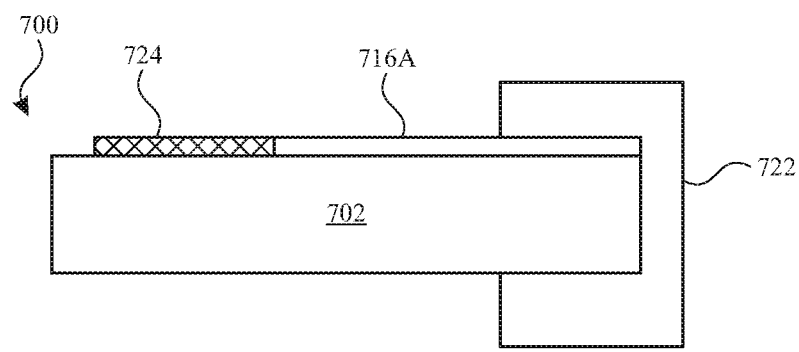
Figure 7F:
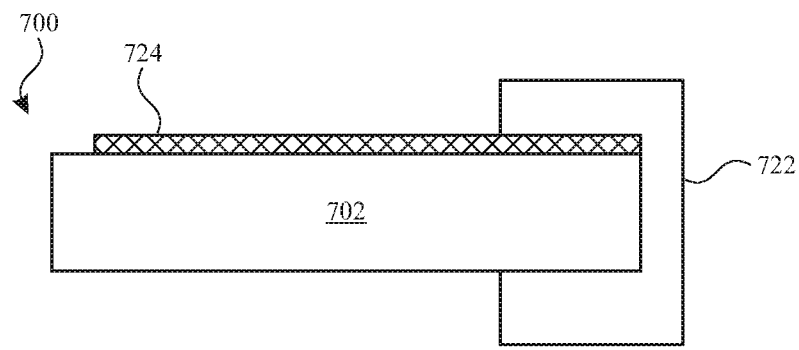
Figure 7G:
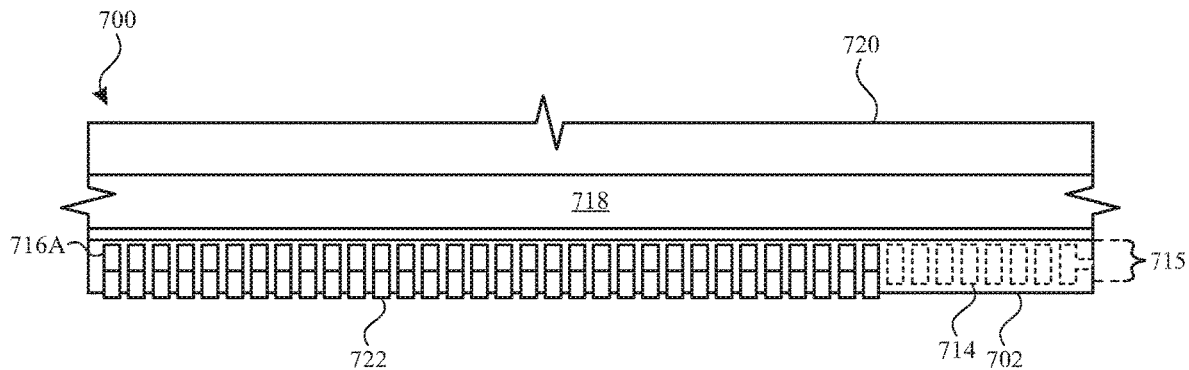
Figure 7H:
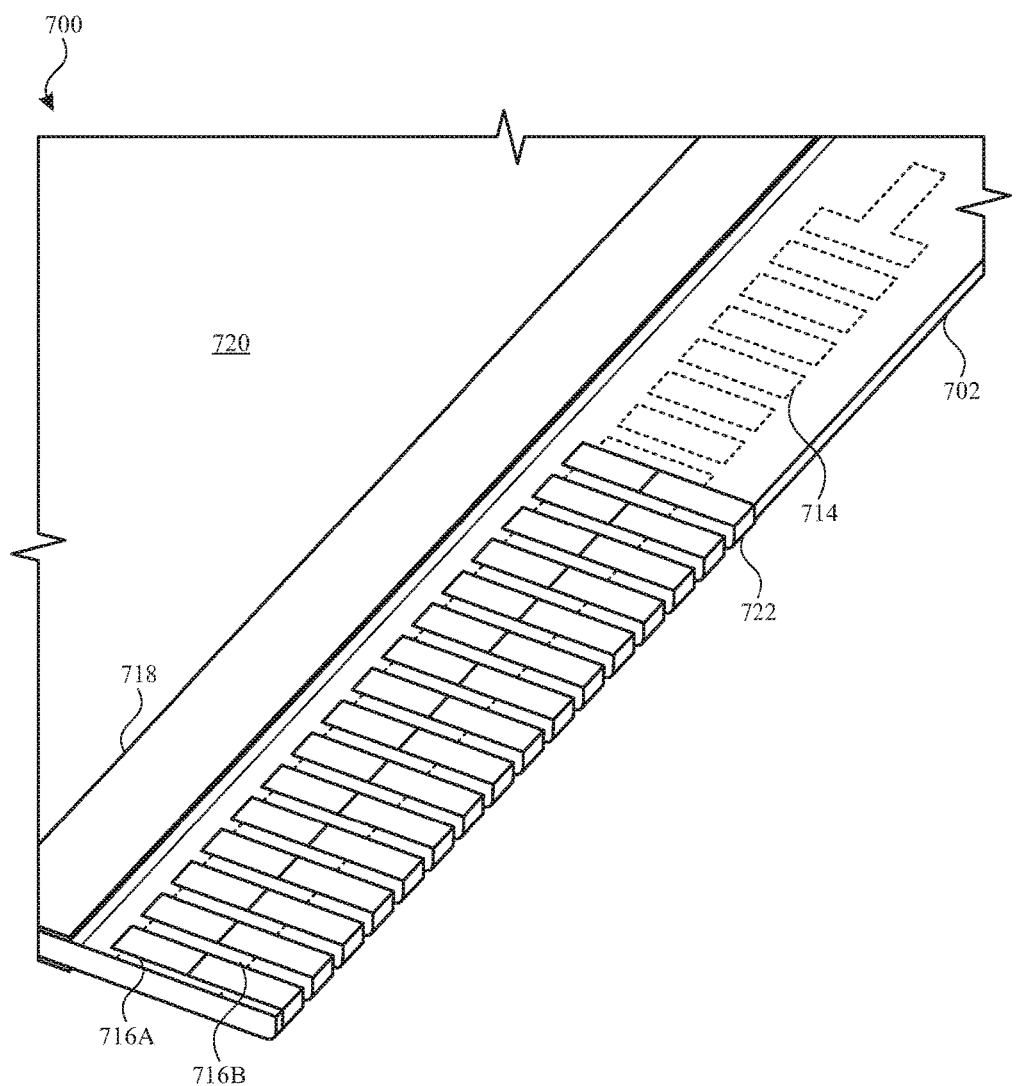

FIGS. 7D-7F illustrate various configurations of a touch sensor panel 700 that includes a conductive trace 722 that wraps around substrate 702 to couple touch electrodes on a first side (e.g., the top) of the substrate to a bond pad region (e.g., bond pad region 715) on the second side (e.g., a bottom side) of the substrate in accordance with some examples of the disclosure. For ease of illustration and description, a single touch electrode on a first side of substrate 702 and conductive trace 722 wrapping around substrate 702 are shown in FIGS. 7D-7F, but it is understood that similar structures can be implemented for trace transfer for multiple touch electrodes (e.g., as shown in FIG. 7H). Additionally, for ease of illustration and description, flex circuit 706 is not shown in FIGS. 7D-7F, but it is understood that flex circuit 706 can be coupled to one or more bond pads and/or conductive traces on the second side of substrate 702 (e.g., touch electrodes on the second side and/or touch electrodes transferred from the first side via conductive traces 722).

As shown in FIG. 7D, in some examples, the touch sensor panel 700 includes a first bond pad 716a on the first side of the substrate 702 and a second bond pad 716b on the second side of the substrate 702. Both the first bond pad 716a and the second bond pad 716b can correspond to a first-side touch electrode. For example, touch sensor panel 700 can further include a conductive trace 724 which can represent a touch electrode on the first side of substrate 702 or an electrical connection (e.g., routing) on the first side of substrate 702 between a touch electrode and bond pad 716a on the first side of substrate 702. In some examples, the conductive trace 724 on the first side of the substrate 702 can include a conductive material that can be the same as or different than the touch electrode (e.g., ITO, copper, etc.). In some examples, bond pads 716a and/or 716b can be metal conductors such as copper (or the like). Conductive trace 722 can wrap around the substrate 702 and can electrically couple bond pad 716a and bond pad 716b. Conductive trace 722 can include a conductive material such as silver or copper. In some examples, the conductive material of conductive trace 722 can be a patterned conductive paste (e.g., silver paste, copper paste, etc.).

FIG. 7E illustrates an alternate configuration of the touch sensor panel 700 using one bond pad rather than two bond pads for trace transfer. As shown in FIG. 7E, in some examples, touch sensor panel 700 includes a bond pad 716a on one side of the substrate 702 coupled to a touch electrode (e.g., by conductive trace 724). The touch electrode (and/or its routing to bond pad 716a) represented by conductive trace 724 can be transferred by way of the bond pad 716a to the second side of substrate 702 via conductive trace 722 (e.g., a conductive metallic paste). In some examples, the touch electrode can be ITO, bond pad 716a can be copper and conductive trace 722 can be a silver paste. The conductive trace 722 can wrap around from the first side of substrate 702 to the second side of substrate 702, without the use of a second bond pad on the second side of substrate 702. The flex circuit (not shown) can be coupled (e.g., via ACF) to conductive trace 722 on the second side of substrate 702. Although bond pad 716a is illustrated in FIG. 7E as being on the first side (e.g., the top side) of substrate 702, in some examples of trace transfer with one bond pad, the bond pad can be on the second side (e.g., the bottom side) of substrate 702, with a placement similar to bond pad 716b in FIG. 7D. In such an example, the conductive trace 722 can be coupled directly to conductive trace 724 (e.g., touch electrode and/or its routing) on the first side and wrapped around to a bond pad on the second side of substrate 702. In some examples, the touch electrode and/or conductive trace 724 can be ITO and conductive trace 722 can be a copper paste.

FIG. 7F illustrates another alternate configuration of the touch sensor panel 700 without bond pads for trace transfer. As shown in FIG. 7F, touch sensor panel can include a conductive trace 724 representing a touch electrode (e.g., ITO) and or its routing disposed on a first side of substrate 702 that can be electrically coupled to another conductive trace 722 that wraps around the substrate from a first side (e.g., the top side) to a second side (e.g., the bottom side) of substrate 702, without the use of a bond pads on either side of substrate 702. The flex circuit (not shown) can be coupled (e.g., via ACF) to conductive trace 722 (e.g., on the second side of substrate 702). In some examples where the touch electrode and/or conductive trace 724 includes ITO and conductive trace 724 is coupled to conductive trace 722 without bond pads (e.g., 716a or 716b), conductive trace 722 can include copper paste, or another conductive material suitable for coupling with the low sheet resistance of ITO touch electrodes. In some examples, other conductive or semi-conductive materials and/or alloys may be used for conductive trace 724 and/or conductive trace 722 (and for bonding pads).

In some examples, conductive traces 722 can connect touch electrodes on a first side of the substrate 702 to a bond pad region 715 on a second side of a substrate 702, enabling touch sensor panel 700 to include a single bond pad region 715 that includes connections to touch electrodes on both sides of the substrate 702. FIGS. 7G-7H illustrate partial views of the border region of a touch sensor panel 700 that includes a bond pad region 715 for single-sided bonding to a flex circuit on one side of the substrate 702. FIGS. 7G-7H can correspond to trace transfer using two bond pads as described above with respect to FIG. 7D. The touch sensor panel 700 can include an opaque mask 718 similar to opaque mask 618 differentiating between an active region 720 and a border region of the touch sensor panel 700. The bond pad region 715 can be included in the border region on a second side of substrate 702, which can surround an active region that includes touch electrodes and/or display pixels. The bond pad region 715 can include a plurality of bond pads 716b connected (via trace transfer techniques) to touch electrodes on the first side of the substrate 702 and a plurality of bond pads 714 connected to touch electrodes on the second side of the substrate 702. The bond pads 716a on the first side of the substrate 702 can be connected to bond pads 716b in bond pad region 715 on the second side of the substrate 702 via trace transfer (e.g., via conductive traces 722).

In some examples, touch electrodes on the first side of substrate 702 can be routed to bond pads 716a on the first side of substrate 702. Bond pads 716a on the first side of the substrate can be coupled to bond pads 716b on the second side of the substrate conductive traces 722 (e.g., conductive paste). The conductive traces 722 can wrap around the substrate 702 from the first side of the substrate to the second side of the substrate. In this way, the touch electrodes disposed on the first side of the substrate 702 can be connected to bond pads 716b on the second side of the substrate 702. Thus, bond pads 716b and bond pads 714 can both be disposed on the same side of the substrate, allowing all of the bond pads 716b and 714 to be connected to one flex circuit 706 (e.g., single-sided bonding).

As described above with reference to FIGS. 7A-7H, single-sided bonding at bond pad region 715 can facilitate connections of touch electrodes of a double-sided sensor to a PCB 712 via a flex circuit 706 (e.g., one flex circuit). By including conductive traces 722 that wrap around the substrate 702 from one side to an opposite side, the bond pad region 715 can include connections to touch electrodes on both sides of the substrate 702, although the bond pad region 715 is on one side of the substrate 702. As stated above, a single-sided bonding to a flex circuit can increase manufacturing yield, provide a more robust connection structure (damage-resistant), reduce the thickness of the stack-up (enabling the touch screen to be thinner) and shrink the border region (enabling the touch screen to occupy more of the device surface) as compared with the double-sided bonding of multiple flex circuits. For example, fewer bonding steps of fewer flex circuits can simplify manufacturing and improve yield (one bonding step for one flex circuit versus multiple bonding steps for multiple flex circuits). For example, a single flex circuit at a single bonding site can provide a more robust connection (e.g., more points of contact in one region) and debugging or repairing damage can be simplified to a single connection point. For example, a touch sensor panel with a flex circuit on one side can be thinner than a touch sensor panel with a flex circuit on both sides. For example, one bond pad region can reduce the number of ground pads and/or fiducials, as ground pads and/or fiducials may be duplicated for each additional flex circuit connection. Additionally, a single flex circuit connection or fewer flex circuit connections can reduce or eliminate the need for interstitial spacing between bond pad regions.

Although trace transfer techniques are discussed above primarily in the context of double-sided touch sensor panels, it should be understood that trace transfer techniques can also be used in the context of a single side of a touch sensor panel. For example, touch electrodes on a first (top) surface of a single-sided touch sensor panel substrate can be routed to a second (bottom) side using trace transfer techniques to enable flex circuit bonding on the second side of the substrate rather than the first side of the substrate (or vis versa). In some examples, trace transfer techniques can be used in a single-sided touch sensor panel to minimize border space. For example, the trace transfer technique can be used to route some touch electrodes from a first side (that includes the touch electrodes) to a second side (that may not include touch electrodes) of the substrate for routing purposes. This can reduce the amount of routing in the border region compared to routing all the traces on the same (first) side of the substrate. The routing traces on the second side of the substrate can then be transferred back to the first side to form a single bond pad region. Alternatively, multiple bond pad regions can be used (e.g., one on a first side of the substrate and one on a second side of the substrate, opposite the first side of the substrate).

Referring back to FIG. 7A, in some examples, PCB 712 on which the touch circuitry may be disposed can be disposed beneath the display/touch screen or in a border region so as not to obscure the display and/or interfere with touch sensing. As a result, in some examples, flex circuit 706 may bend 180 degrees. In some examples, it can be advantageous to reduce the amount that a flex circuit bends (e.g., number of degrees) to connect the touch electrodes of a touch sensor panel to touch circuitry. In some examples, the flex circuit can be bonded perpendicular to the touch sensor panel stack-up (e.g., on a third side perpendicular to the first and second sides) such that the amount of bend can be reduced by 90 degrees. Reducing the amount of bend of a flex circuit can reduce the amount of strain the connection between the bond pads and the flex circuit are subjected to, thereby increasing the reliability and durability of the connection between the touch electrodes of the touch sensor panel and the flex circuit and, therefore, of the touch sensor panel overall. It should be understood that reducing the amount of bend of the flex circuit can be used with or independent from the trace transfer techniques described above with respect to FIGS. 7B-7H.

Figure 8A:
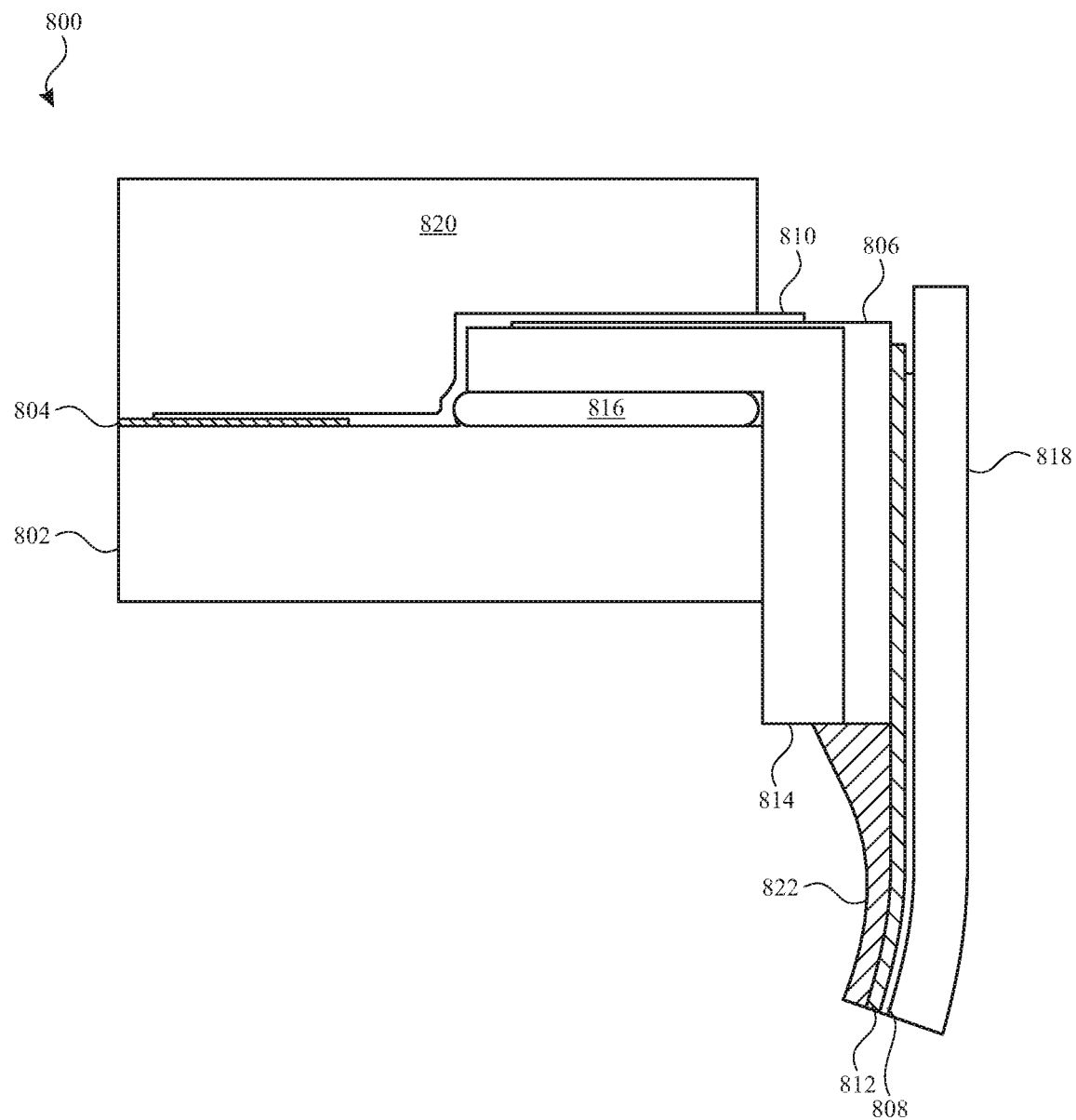
FIG. 8A illustrates an exemplary touch sensor panel including perpendicular bonding of the flex circuit according to some examples of the disclosure.
Figure 8B:
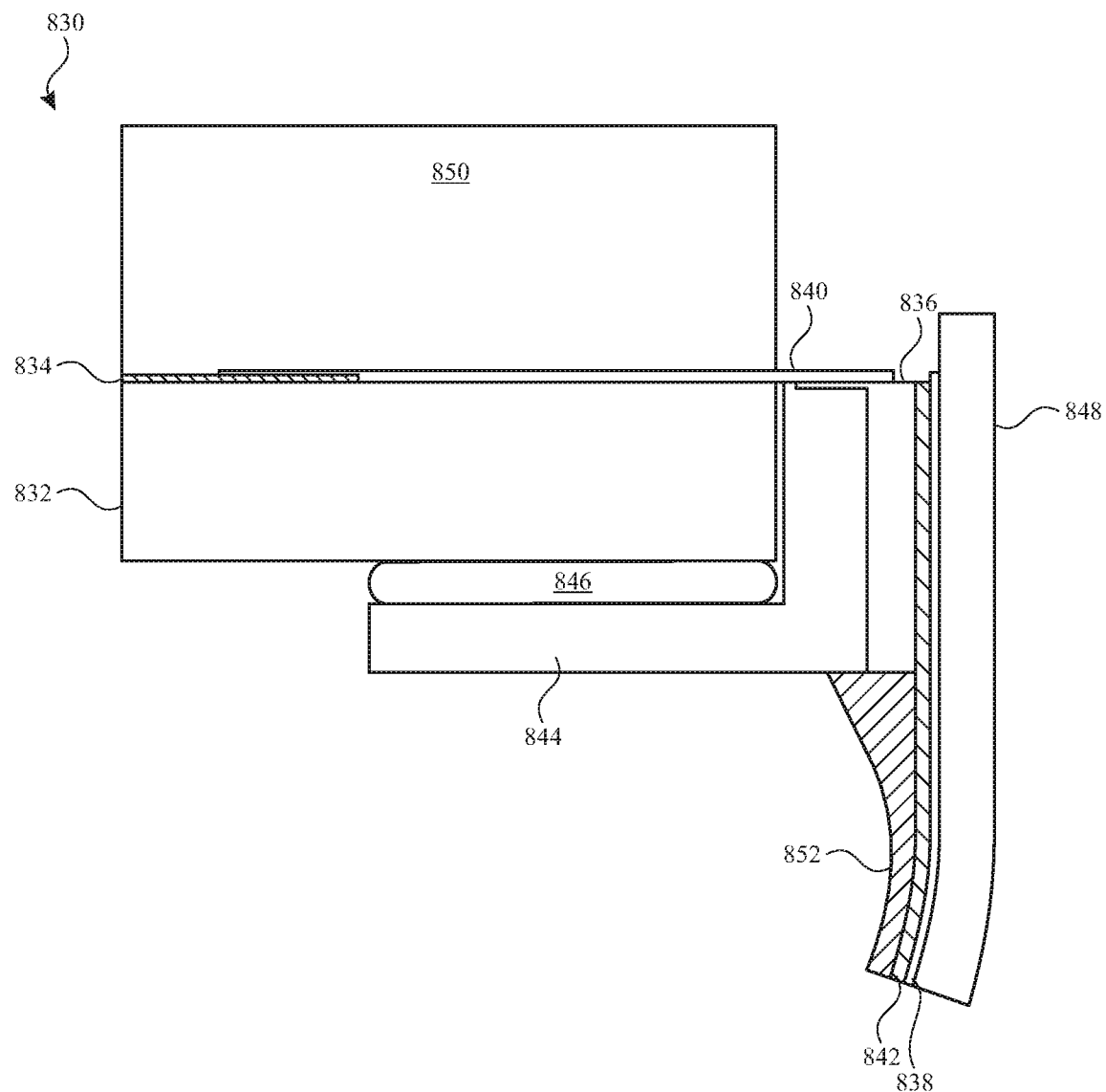
FIG. 8B illustrates an exemplary touch sensor panel including perpendicular bonding of the flex circuit according to some examples of the disclosure.
Figure 8C:
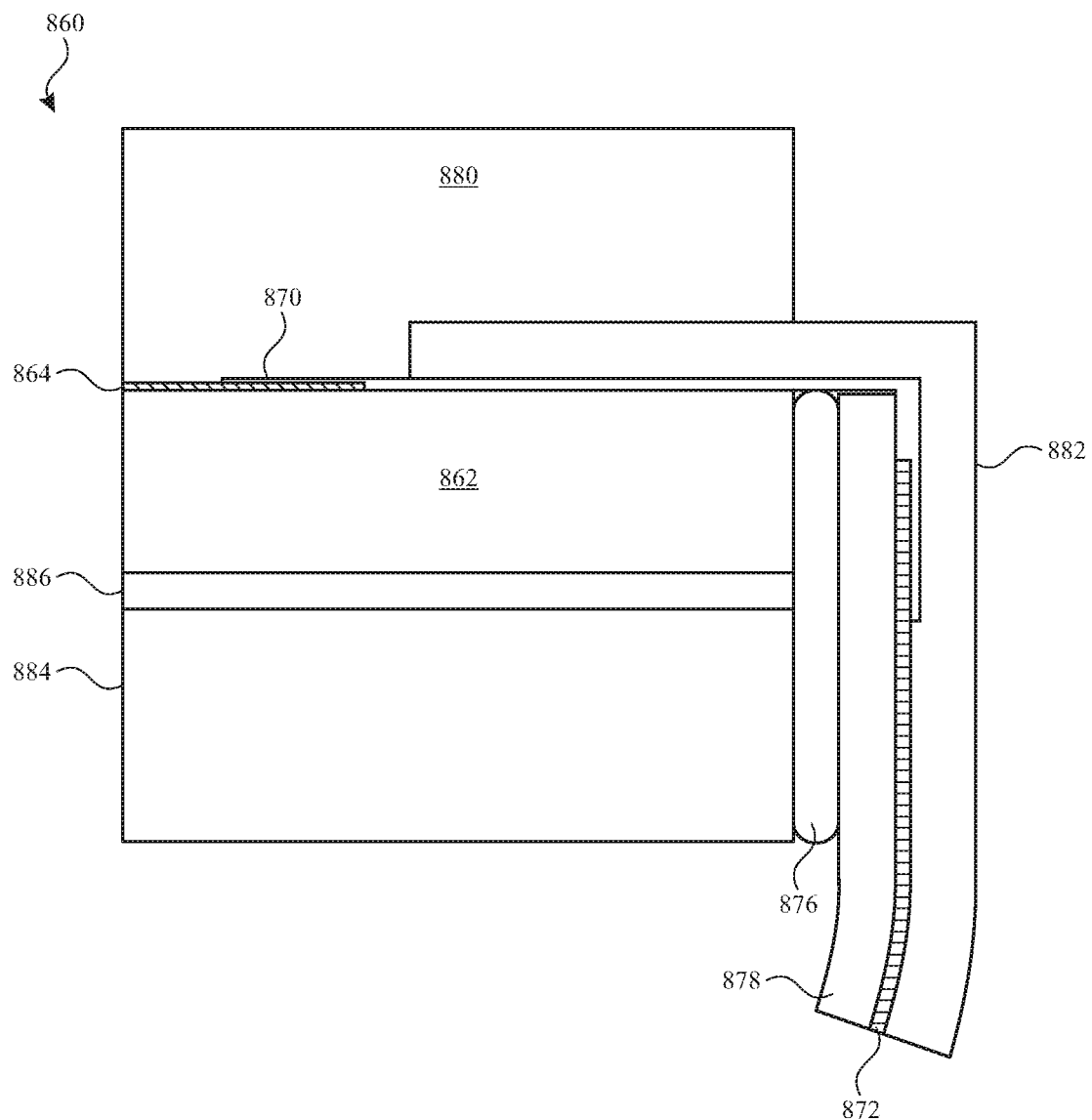
FIG. 8C illustrates an exemplary touch sensor panel including perpendicular bonding of the flex circuit according to some examples of the disclosure.

FIGS. 8A-8C illustrate exemplary touch sensor panels that include perpendicular bonding of the flex circuit according to some examples of the disclosure. Perpendicular bonding can enable the flex circuit to be disposed on a side surface of the touch sensor stack-up (e.g., parallel to the third side of the substrate) that is perpendicular to the surface of the touch sensor stack-up (e.g., perpendicular to the top surface or bottom surface (first side or second side) of the substrate on which the touch electrodes can be disposed). Orienting the flex circuit in this way can enable the flex circuit to connect the touch electrodes to the touch circuitry with less bending than the amount of bending of the flex circuits included in the touch sensor panels described above with reference to FIGS. 7B-H (e.g., 90 degrees of bending rather than 180 degrees of bending).

FIG. 8A illustrates an exemplary touch sensor 800 panel including perpendicular bonding of the flex circuit according to some examples of the disclosure. Touch sensor panel 800 can include substrate 802 and flex circuit 818 oriented perpendicular to the top surface of substrate 802. In some examples, one or more touch electrodes can be disposed on a (top) surface of substrate 802 (first side of the substrate) and can be connected to one or more bonding pads 804. For ease of illustration, one bond pad 804 corresponding to one touch electrode is shown. However, it should be understood that touch sensor panel 800 can include additional bond pads (e.g., one bond pad per touch electrode).

In some examples, rather than coupling the bond pad to a conductive trace of the flex circuit via an ACF bond (e.g., a direct bond), bond pad 804 can be coupled to flex circuit 818 via an interposer. The interposer can reduce the amount of bend of the flex circuit. In some examples, the interposer can be a printed circuit board with an "L" shape as shown by interposer PCB 814. For example, the "L" shape interposer PCB 814 can include a first portion parallel to the (top) surface of the substrate 802 on which one or more touch electrodes can be disposed and a second portion perpendicular to the (top) surface of substrate 802. Interposer PCB 814 can be attached to substrate 802. For example, interposer PCB 814 can be bonded to substrate 802 with an adhesive 816 (e.g., epoxy). In some examples, the interposer PCB 814 can be bonded to substrate 802 in other ways (e.g., solder bonds, etc.). Although adhesive 816 is shown on the top surface of substrate 802 (first side of substrate 802), in some examples, adhesive can be disposed on the third side of substrate 802 (perpendicular to the first side) in addition to or instead of on the top of substrate 802.

Interposer PCB 814 can include bond pads and/or other conductive traces 806 on the surface of the interposer PCB 814 and/or internal to interposer PCB 814 to enable connections to bond pad 804 on the first portion of interposer PCB 804 and to enable connections to flex circuit 818 on the second portion of interposer PCB 804. In some examples, a trace transfer technique can be used to deposit conductive material (e.g., forming conductive traces, such as conductive trace 810) to electrically couple the bond pads of one or more touch electrodes (e.g., bond pad 804) to the conductive traces 806 of interposer PCB 814. For example, bond pad 804 (e.g., in a bond pad region of the touch sensor panel 800) can be disposed on the top surface of substrate 802 and can be electrically coupled to a touch electrode. Bond pad trace 804 can include a conductive material, such as an opaque conductive material (e.g., copper, gold, silver, etc.) or a transparent or partially transparent conductive material (e.g., ITO, AZO, etc.). Conductive trace 810 can couple bond pad 804 and conductive trace 806 together, facilitating the electrical coupling of the touch electrodes to interposer PCB 814. In some examples, conductive trace 810 can be deposited using wire bonding techniques. However, wire bonding can require high temperatures that can cause damage to other components of the touch sensor panel 800, such as bond pad 804, substrate 802, touch electrodes, or other components of the touch sensor panel 800. Therefore, in some examples, conductive trace 810 can be deposited using an aerosolized conductive material, such as silver or other suitable conductive materials. Aerosol techniques can be performed at relatively low temperatures, thereby protecting the other components of the touch sensor panel 800 during assembly.

Conductive trace 806 (representative of multiple traces for routing bond pads to the flex circuit) can be disposed on (and/or in) the interposer PCB 814. Like the interposer PCB 814, conductive trace 806 can wrap around the touch sensor panel 800 from a (top) surface that is parallel to the surface of the substrate 802 on which the touch electrodes can be disposed to a surface (e.g., the third side or parallel to the third side) that is perpendicular to the surface on which the touch electrodes can be disposed, for example.

As described herein, in some examples, flex circuit 818 can be disposed in a plane perpendicular to (or otherwise intersecting) the plane in which the touch electrodes can be disposed on the (top) surface of substrate 802. Orienting flex circuit 818 in this way can reduce the bend (e.g., reduce the number of degrees of bend) required by the flex circuit 818 to connect the touch electrodes to touch circuitry located elsewhere (e.g., behind the display) in the electronic device incorporating touch sensor panel 800. For example, in some situations, a flex circuit can bend a number of degrees on the order of 180 degrees (e.g., 170-190 degrees) in order to connect touch electrodes to touch circuitry behind the display. Interposer PCB 814 and flex circuit 818 included in touch sensor panel 800, however, can connect the touch electrodes to touch circuitry by flex circuit bending on the order of 90 degrees (e.g., 80-100 degrees). Reducing the amount that flex circuit 818 bends can reduce the amount of strain experienced by the flex circuit.

Flex circuit 818 can be electrically coupled to the interposer PCB by way of conductive traces 806 of interposer PCB 814 and conductive traces 808 (formed from a conductive material such as copper, gold, silver, or the like) of flex circuit 818. In some examples, the electrical connection can also be made by conductive bonding 812 (e.g., a conductive adhesive or other form of bonding material). In some examples, conductive bonding 812 can be electrically coupled to conductive trace 806. Conductive bonding 812 can be implemented with an anisotropic conductive film or surface mount technology (SMT), for example.

As discussed above, conductive trace 806 can be disposed on (and/or in) the interposer PCB 814 such that a portion of conductive trace 806 can be included on the first portion of interposer PCB 814 parallel or substantially parallel to the touch electrodes on the top surface of substrate 802 and a portion of conductive trace 806 can be included on the second portion of interposer PCB 814 perpendicular or substantially perpendicular to the touch electrodes on the top surface of substrate 802. As described above, conductive trace 806 can be electrically coupled to the touch electrodes via bonding pad 804 and conductive trace 810. Therefore, connecting the flex circuit 818 to conductive trace 806 on the second portion of interposer PCB 814 can connect flex circuit 818 to the touch electrodes with reduced bend.

In some examples, touch sensor panel 800 can further include strain relief 822. Strain relief can be provided by an adhesive or other suitable material with low stiffness (e.g., less than a threshold Young's modulus) disposed to carry some of the mechanical load of the bending of the flex circuit (thereby relieving stress concentrations). Strain relief 822 can provide structural and/or mechanical support to the flex circuit 818 at the location of the flex circuit that bends to connect to the touch circuitry, to further reduce strain on the connection between flex circuit 818 and the remaining circuitry (e.g., interposer PCB 814, etc.). Additionally, touch sensor panel 800 can include an adhesive layer 820 disposed over the touch electrodes, bond pads and conductive traces, for example. The adhesive layer 820 can be an optically clear adhesive and can provide electrical isolation, and mechanical and/or environmental protection, for example.

As shown in FIG. 8A, the touch sensor panel 800 can include a flex circuit 818 that can bend on the order of 90 degrees (e.g., 80-100 degrees) to connect one or more touch electrodes of the touch sensor panel to touch circuitry. Arranging the flex circuit 818 such that it bends about 90 degrees can decrease the strain experienced by the flex circuit compared with a bend of about 180 degrees, thus increasing the durability and reliability of touch sensor panel 800.

FIG. 8B illustrates an exemplary touch sensor 830 panel including perpendicular bonding of the flex circuit according to some examples of the disclosure. Touch sensor panel 830 can include a substrate 832 (e.g., similar to substrate 802), bond pad 834 (e.g., similar to bond pad 804), conductive traces 836, 838, and 840 (e.g., similar to conductive traces 806, 808, and 810), conductive bonding 842 (e.g., similar to conductive bonding 812), interposer PCB 844 (e.g., similar to interposer PCB 814), adhesive 846 (e.g., similar to adhesive 816), flex circuit 848 (e.g., similar to flex circuit 818), adhesive layer 850 (e.g., similar to adhesive layer 820), and strain relief 852 (e.g., similar to strain relief 822). For brevity the similar description of these components is not repeated here.

Touch sensor panel 830 can be similar to the touch sensor panel 800 described above with respect to FIG. 8A, but in FIG. 8B, interposer PCB 844 can be bonded to substrate 832 on a (bottom) side (second side) of the substrate opposite from the (top) side (first side) of the substrate including bond pads 834 that can be coupled to the one or more touch electrodes of touch sensor panel 830. Moving the interposer PCB 844 to the second side of substrate 832 can enable a simplified connection between bond pad(s) 834 and the interposer conductive trace(s) 836 via conductive trace(s) 840. In some examples, conductive trace 840 can be deposited using an aerosolized conductive material, such as silver. However, in some cases, conductive trace 840 can be formed by depositing the conductive material without the need for aerosolizing the conductive material.

Adhering interposer PCB 844 to the (bottom) side of substrate 832 opposite from the (top) side of the substrate including the bond pads can provide more surface area (because the bottom side of substrate 832 does not include bond pads 834) for adhesive 846 and enable the use of more of adhesive 846 (e.g., epoxy) for attaching the interposer PCB to the substrate relative to touch sensor panel 800. Touch sensor panel 800, for example, can include adhesive 816 and bond pads 804 on the same side of substrate 802, which results in less surface area for the adhesive to avoid adhesive 816 overlapping bond pads 804. It can be advantageous to avoid overlapping adhesive 816 with bond pads 804 because the non-conductive adhesive overlapping the bond pad can reduce the area of the bond pad available for electrical contact with conductive traces 810.

FIG. 8C illustrates an exemplary touch sensor panel 860 including perpendicular bonding of the flex circuit according to some examples of the disclosure. Touch sensor panel 860 can include a substrate 862 (e.g., similar to substrate 802 or 832), bond pads 864 (e.g., similar to bond pads 804 or 834), conductive traces 870 and 872 (e.g., similar to conductive traces 806, 808, 810, 836, 838, and 840), flex circuit 878 (e.g., similar to flex circuit 818 or 848), adhesive layer 880 (e.g., similar to adhesive layers 820 or 850), strain relief 882 (e.g., similar to strain relief 822 or 852). For brevity the similar description of these components is not repeated here.

Touch sensor panel 860 can be similar to the touch sensor panel 800 and 830 described above with respect to FIGS. 8A-8B, but touch sensor panel 860 may not include an interposer PCB (e.g., interposer PCB 814 or 844) or may also not include conductive bonding similar to conductive bonding 812 or 842. Instead, the flex circuit can bonded to the side (e.g., third side) of touch sensor panel 860, as described in more detail below.

Touch sensor panel 860 can be included with a display to form a touch screen. Thus, the touch screen including touch sensor panel 860 can also include a polarizer 884 (for the display) that can be bonded to substrate 862 with an adhesive layer 886. As shown in FIG. 8C, flex circuit 878 can be bonded to the touch screen including substrate 862 of the touch sensor panel and polarizer 884 with adhesive 876 (e.g., epoxy). The combined thickness of polarizer 884 and substrate 862 can create sufficient stack-up height to provide surface area for adhesive 886 to support flex circuit 878 without the use of an interposer PCB. In some examples, the thickness of the touch sensor panel may be sufficient and flex circuit 878 can be bonded to substrate 862 without also bonding to polarizer 884.

Bond pad(s) 864, which can be connected to one or more touch electrodes of touch sensor panel 860, can be coupled to conductive trace(s) 872 of flex circuit 878 via conductive trace 870. Conductive trace(s) 870 can include a conductive material (e.g., silver) formed using an aerosol technique, such as the aerosol technique for trace transfer described above with reference to FIG. 8A. Conductive trace(s) 870 can wrap around from the top side of substrate 862 to the conductive trace(s) 872 of flex circuit 878.

Strain relief 882 (e.g., potting) can be disposed over the conductive trace(s) 870 and/or 872, and over the flex circuit 878 to reduce the amount of strain experienced by the flex circuit 878, for example. In some examples, additional strain relief can be provided on the opposite side of flex circuit 878 (e.g., below polarizer 884) similar to strain relief provided by strain relief 822 in FIG. 8A. Bonding flex circuit 878 to the side (third side) of the touch sensor panel as shown in FIG. 8C can reduce the bend of the flex circuit on the order of 90 degrees (e.g., 80-100 degrees) to connect the one or more touch electrodes to touch circuitry.

Figure 9A:
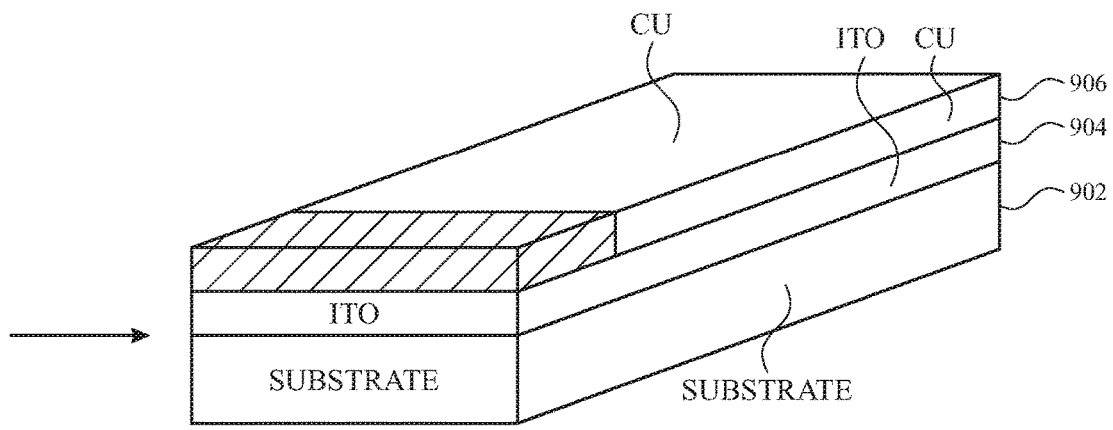
FIGS. 9A-10C illustrate exemplary bond pads formed on a substrate according to examples of the disclosure.
Figure 9B:
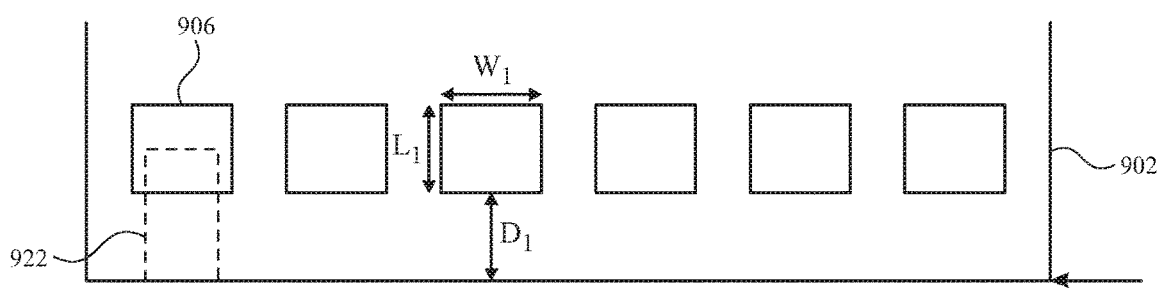

Some of the examples described herein include bond pads for use with trace transfer techniques and/or flex circuit bonding. FIGS. 9A-10C illustrate exemplary bond pads formed on a substrate according to examples of the disclosure. For example, FIGS. 9A-9B illustrate exemplary rectangular bond pads according to examples of the disclosure. As illustrated in the top view of FIG. 9B for example, a bond pad region can be disposed on a first (top) side of substrate 902. The bond pads included in the bond pad region can have a rectangular shape (length $L_1$ and width $W_1$), among other possible shapes, and can be disposed a distance (D1) from an edge (indicated by the arrow in FIG. 9B) of substrate 902. The distance between the bond pads and the edge of substrate 902 can, for example, provide tolerance for die cutting or other singulation processes.

FIG. 9A illustrates a perspective view of a portion of substrate 902, bond pad 906 and a transparent conductive material 904. For example, the touch sensor panel can be formed using a substrate (e.g., cyclo olefin polymer (COP), PET, polycarbonate (PC) or other suitable material) overlaid on a first side with one or more layers of transparent (or partially transparent) conductive material (e.g., ITO) and/or one or more layers of non-transparent conductive material (e.g., copper). In some examples, the overlaid conductive layers can be mirrored on the second side of the substrate. For ease of illustration and description one ITO layer and one copper layer on one side of a substrate are shown in FIG. 9A, but it is understood that additional or different layers can be disposed on one or both sides of the substrate. During a fabrication step, the copper between the edge of substrate 902 and bond pad 906 can be etched away to form bond pad 906 (e.g., to define the boundary of bond pad 906 proximate to the edge of substrate 902). Removing the copper between the edge of substrate 902 and bond pad 906 can enable singulation techniques to be applied to the edge of substrate 902 without cutting through copper. The fabrication step can etch copper without etching the underlying ITO layer 904. As a result, bond pad 906 can be electrically contacted from the edge of substrate 902 via the ITO layer 904 during fabrication/assembly (e.g., to avoid electrostatic discharge (ESD) events or other electrical stress events). During a subsequent fabrication step, trace transfer techniques can be used dispose a conductive trace 922 to route bond pad 906 off of the first side of the substrate (e.g., for connection to a flex circuit on the second or third side of the substrate as described herein). As described herein, in some examples, the conductive trace 922 can be a silver paste (or other suitable material).

Figure 10A:
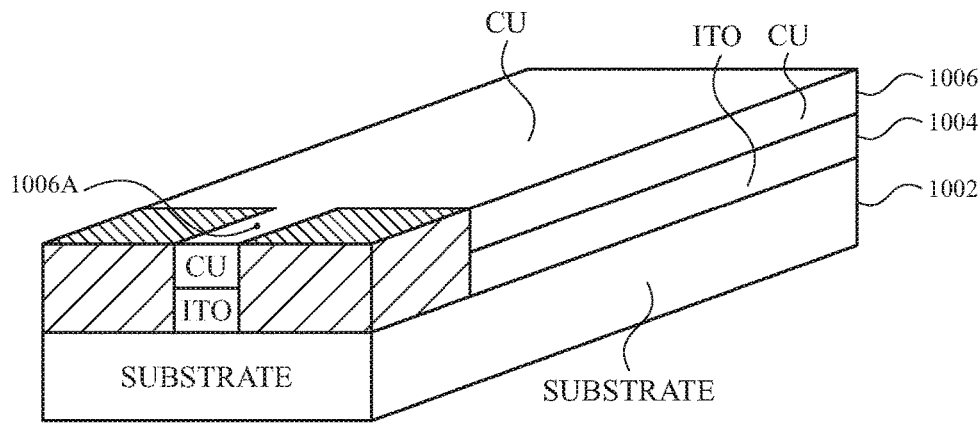
Figure 10B:
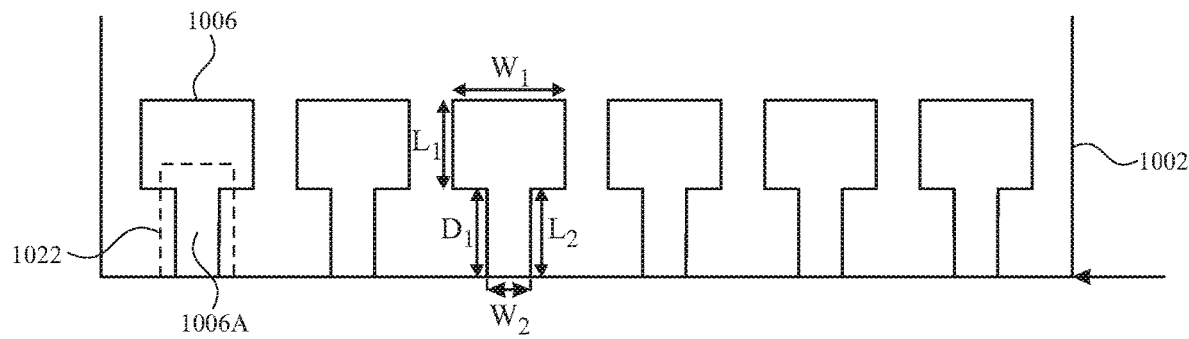
Figure 10C:
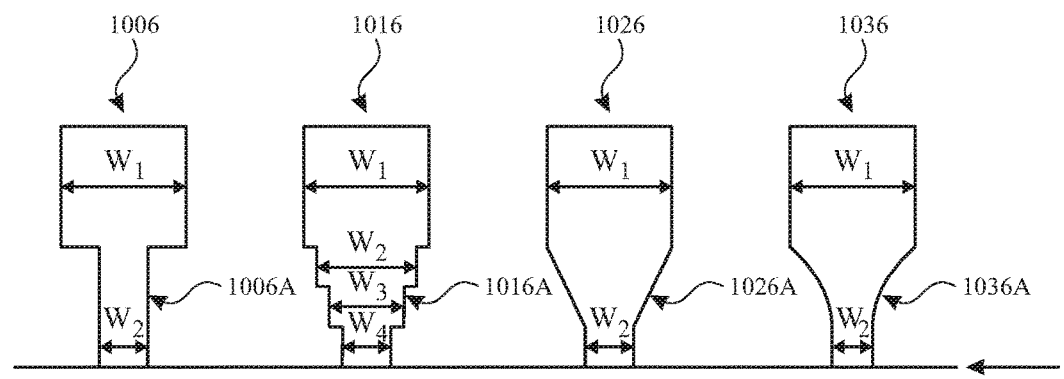

FIGS. 10A-10B illustrate exemplary bond pads including a tail portion according to examples of the disclosure. Unlike the rectangular bond pads of FIG. 9A-9B, bond pads in the bond pad region disposed on a first (top) side of substrate 1002 can include tail portion 1006A extending from the rectangular portion of bond pad 1006. The tail portion 1006A can extend to the edge of substrate 1002. The rectangular portion of bond pad 1006 can have dimensions including length $L_1$ and width $W_1$. The tail portion of the bond pads included in the bond pad region can also have a rectangular shape (length $L_2$ (e.g., the same dimension as $D_1$) and width $W_2$). The tail portion 1006A of bond pad 1006 can be narrower (e.g., within a threshold distance from the edge) than a rectangular portion of bond pad 1006 (e.g., outside the threshold distance from the edge), such that $W_2 < W_1$. The shape of the bond pad and/or tail can be different than the rectangular shapes illustrated in FIGS. 10A-10B. Some other exemplary possibilities are illustrated in FIG. 10C, described below in more detail.

The rectangular portion of the bond pads can be disposed a distance (D1) from an edge (indicated by the arrow in FIG. 10B) of substrate 1002. The distance between the bond pads and the edge of the substrate 1002 can for example, provide tolerance for die cutting or other singulation process. The width $W_2$ of tail portion 1006A of bond pad 1006 can be less than $W_1$ such that the conductive material (e.g., copper) may be cut using singulation techniques. In some examples, $W_2$, can be less than a threshold amount (e.g., <10 microns) to enable cutting using singulation techniques.

In some examples, the dimensions of the rectangular portion of the bond pads in FIG. 10B and the rectangular bond pads in FIG. 9B can be the same dimensions (e.g., $W_1$ and $L_1$ can be the same values in both FIGS. 9B and 10B). In some examples, the dimension of the rectangular portion of the bond pads in FIG. 10B and the rectangular bond pads in FIG. 9B can be different dimensions (e.g., $W_1$ and/or $L_1$ can be different values in FIG. 9B as compared with FIG. 10B). In some examples, due to the addition of the tail portion 1006A, the dimensions of the rectangular portion of bond pads 1006 can be reduced compared with the dimensions of rectangular bond pads 906 (e.g., due to the increased contact area provided by the tail portion 1006A). In some examples, by reducing the size of the rectangular portion of the bond pads (e.g., by reducing $L_2$), the bond pad region (and the border region) can be reduced and more of the touch sensor panel substrate area can be used for the active region.

FIG. 10A illustrates a perspective view of a portion of substrate 1002, bond pad 1006 including tail portion 1006A, and a transparent conductive material 1004. For example, the touch sensor panel can be formed using from a substrate with overlaid conductive layers as described with respect to FIG. 9A. During a fabrication step, the copper and ITO between the edge of substrate 1002 and bond pad 1006, excluding the copper and ITO of tail portion 1006A, can be etched away to form bond pad 1006 including tail portion 1006A. Reducing the width of the tail portion can enable singulation techniques despite the presence of some copper at the edge. Unlike the formation of bond pad 906 using a fabrication step that can etch copper without etching the underlying ITO layer, the formation of bond pad 1006 including tail portion 1006A can use a fabrication step that can etch both copper and the underlying ITO layer. In some examples, the fabrication step etching both copper and ITO can be earlier in the fabrication process than the fabrication step etching copper without etching ITO. As a result, the earlier fabrication process can reduce tolerance related errors by defining a feature of bond pad 1006 (e.g., to define the boundary of bond pad 1006 proximate to the edge of substrate 1002) in an earlier step (e.g., due to mismatch tolerances between different masking steps). The tail portion 1006A also provides access for electrically contacting bond pad 1006 from the edge of the substrate during fabrication (e.g., to avoid ESD or other electrical stress events).

During a subsequent fabrication step, trace transfer techniques can be used dispose a conductive trace 1022 to route bond pad 1006 off of the first side of the substrate (e.g., for connection to a flex circuit on the second or third side of the substrate as described herein). As described herein, in some examples the conductive trace 1022 can be a silver paste (or other suitable material). In some examples, conductive trace 1022 can overlap tail portion 1006A entirely. For example, a conductive trace of silver entirely overlapping the tail portion 1006A formed of copper can provide corrosion protection for the copper tail portion, as the silver may be less chemically active. Additionally, the silver can be self-passivating. In some examples, conductive trace 1022 can at least partially overlap the rectangular portion of bond pad 1006 (e.g., as shown in FIG. 10B) to provide an electrical connection for trace transfer. In some examples, conductive trace 1022 may not overlap the rectangular portion of the bond pad 1006 at all, and the electrical connection can be provided by the overlap of the conductive trace and the tail portion 1006A.

It should be understood that although FIG. 9B and FIG. 10B respectively illustrate a bond pad region including uniform bond pads, that the bond pads need not be uniform. In some examples, one or more of the bond pads (at least one) could be a rectangular bond pad 906 as illustrated in FIG. 9B. In some examples, one or more of the bond pads (at least one) could include a bond pad 1006 including a rectangular portion and a tail portion 1006A. Additionally, it should be understood that although FIGS. 9A-10B illustrate bond pads with a rectangular shape (with or without a rectangular tail portion), the shape of one or more of the bond pads and/or the shape of the tail can be different. For example, FIG. 10C illustrates some shapes for bond pads including a tail portion according to examples of the disclosure. For reference, FIG. 10C includes bond pad 1006 including a rectangular portion and tail portion 1006A with a rectangular shape. In some examples, the width of bond pad 1016 can taper in the tail portion 1016A from the rectangular portion in a series of steps. For example, the width $W_1$ of the bond pad in the rectangular portion can gradually narrow in steps to $W_2$, $W_3$ and ultimately $W_4$ (where $W_1 > W_2 > W_3 > W_4$). Although three steps are shown for bond pad 1016, it should be understood that more (e.g., 4, 10, etc.) or fewer (e.g., 2) steps are possible. In some examples, the bond pad 1026 can taper linearly in the tail portion 1026A from the rectangular portion. For example, the width $W_1$ of the bond pad in the rectangular portion can narrow linearly from $W_1$ to $W_2$ (where $W_1 > W_2$). Although linear steps or a linear taper are shown in FIG. 10C, the steps or taper may be non-linear in some examples. For example, bond pad 1036 can taper non-linearly in the tail portion 1036A from the rectangular portion. For example, the width $W_1$ of the bond pad in the rectangular portion can narrow non-linearly (with a curvature) from $W_1$ to $W_2$ (where $W_1 > W_2$).

For ease of illustration and description FIGS. 9A-10C illustrate bond pads on one side of a substrate. It is understood that bond pads can be formed on the second side of the substrate. For example, FIGS. 10A-10B illustrate a bond pad 1006 formed on the first (top) side of the substrate with a tail portion 1006A extending to a first (top) edge of the substrate. In a similar manner, a bond pad can be formed on the second (bottom) side of the substrate with a tail portion extending to a second (bottom) edge of the substrate. Trace transfer techniques described herein can be used to deposit a conductive trace (e.g., silver paste) to connect the bond pad on the first side of the substrate to the bond pad on the second side of the substrate. The conductive trace can wrap around the first (top) edge of the substrate, the third side, and the second (bottom) edge of the substrate.

As described herein, the trace transfer techniques can include wrapping one or more conductive traces around the substrate (e.g., as illustrated by conductive trace(s) 722 in FIGS. 7B-7H) or off the substrate (e.g., as illustrated by conductive traces 810, 840, 870 in FIGS. 8A-8C). In some examples, the thickness and/or width of the conductive traces can be increased to provide increased structural stability. For example, the thickness and/or width of the conductive traces can be increased at or near edges of the substrate (e.g., at a first distance from an edge) where defects, such as burrs, may be more likely to occur (e.g., during a singulation process). The thickness and/or width of the conductive traces at or near the bond pads (e.g., at a second distance from the edge, greater than the first distance) can be less than the thickness and/or width of the conductive traces at or near the edges. As another example, the thickness and/or width of the conductive traces can be increased in areas where the of the conductive traces change direction (e.g., 90 degree turns or other changes in direction greater than a threshold number of degrees). For example, the conductive trace(s) 722 in FIGS. 7B-7H include two 90 degree turns at the top and bottom edge of the substrate that can make the conductive traces brittle or structurally weak. Likewise, conductive trace 810 in FIG. 8A can include two 90 degree turns from the substrate up to interposer 814.

Figure 11A:
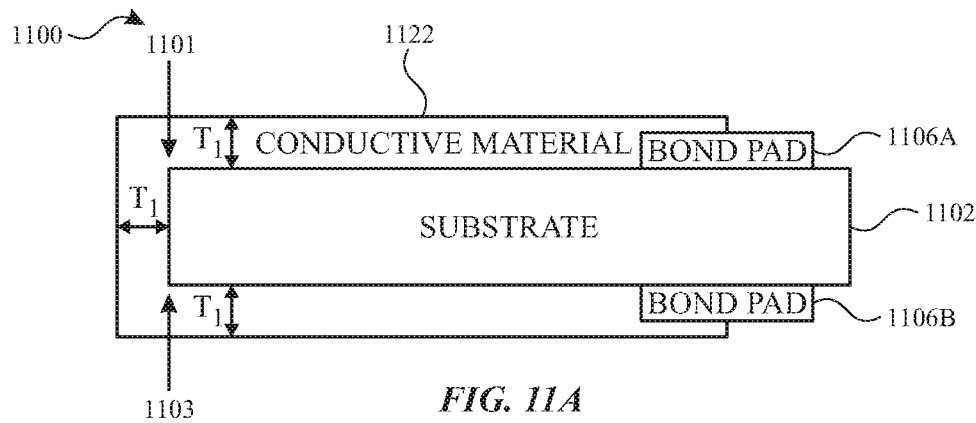
FIGS. 11A-11D illustrate exemplary touch sensor panels including conductive traces with variable thickness according to examples of the disclosure

FIGS. 11A-11D illustrate exemplary touch sensor panels including conductive traces with variable thickness according to examples of the disclosure. FIG. 11A illustrates a touch sensor panel 1100 with uniform thickness ($T_1$) for the conductive trace 1122 between first bond pad 1106A and first (top) edge 1101 of substrate 1102, between second bond pad 1106B and second (bottom) edge 1103 of substrate 1102, and between first (top) edge 1101 of substrate 1102 and second (bottom) edge 1103 of substrate 1102. Although shown as a uniform thickness, in some examples, the thickness of conductive trace 1122 on the first side, second side and/or third side can be different from one another, but may be uniform for the respective side. For example, the thickness of conductive trace 1122 between first bond pad 1106A and first (top) edge 1101 can be a first thickness ($T_1$), the thickness of conductive trace 1122 between second bond pad 1106B and second (bottom) edge 1103 can be a second thickness ($T_2$), and thickness of conductive trace 1122 between first (top) edge 1101 and second (bottom) edge 1103 can be a third thickness ($T_3$), where $T_1$, $T_2$, and $T_3$ can be different. Although conductive trace 1122 is shown on wrapping around (on three sides of substrate 1102), it is understood that the conductive trace may be implemented on fewer than all illustrated sides.

Figure 11B:
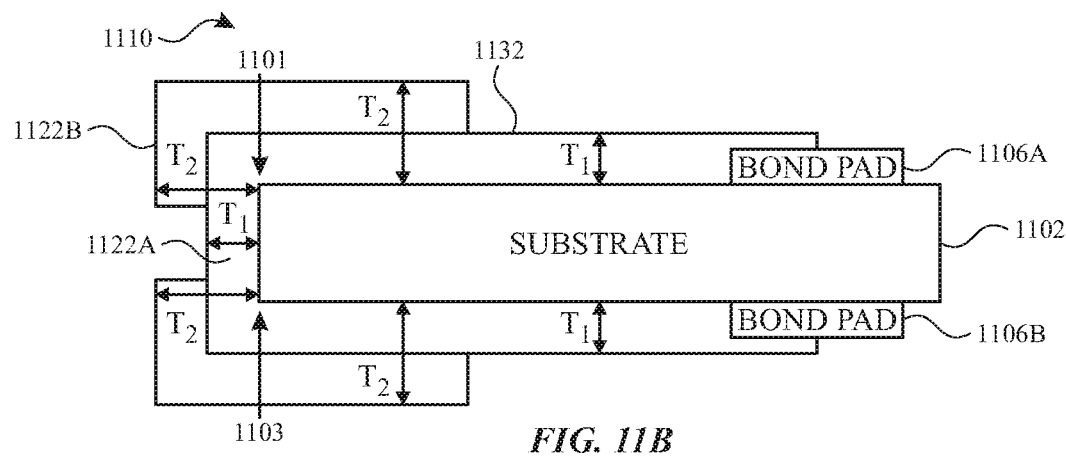

In some examples, additional conductive material can be deposited near the edges of the substrate. In some examples, the conductive material can be added in one or more steps to achieve the desired thicknesses for the conductive trace. In some examples, the conductive material can be added in multiple deposition steps (e.g., a first deposition step can add a uniform thickness for the conductive trace and a second deposition step can add additional thickness at the edges/corners). FIG. 11B illustrates a touch sensor panel 1110 with a non-uniform thickness for conductive trace 1132 between first bond pad 1106A and first (top) edge 1101 of substrate 1102, between second bond pad 1106B and second (bottom) edge 1103 of substrate 1102, and between first (top) edge 1101 and second (bottom) edge 1103. For example, the thickness of conductive trace 1132 between first bond pad 1106A and first edge 1101 can increase (e.g., in a linear or non-linear step) from a first thickness ($T_1$) at or near bond pad 1106A to a second thickness ($T_2$) at or near first edge 1101. The thickness of conductive trace 1132 between second bond pad 1106B and second edge 1103 can increase from a first thickness ($T_1$) at or near bond pad 1106B to a second thickness ($T_2$) at or near second edge 1103. The thickness of conductive trace 1132 between first edge 1101 and second edge 1103 can be a first thickness at or near a midpoint between edges 1101 and 1103 on the third side, and can increase to a second thickness ($T_2$) at or near edges 1101 and 1103. Although thicknesses of conductive trace 1132 are shown to increase in a similar manner on the first, second and third sides in FIG. 11B, it should be understood that the increases may occur on fewer sides and the thickness and/or increases in thickness may be different on each side. For example, the thickness of conductive trace 1132 on the third side between edges 1101 and 1103 can be of a uniform thickness $T_2$ (unlike the illustration including a step down to thickness $T_1$ at or near the midpoint of the third side). In some examples, the maximum thickness of the conductive trace on the third side can be greater than the maximum thickness on the first or second sides at or near edges 1101 and 1103. In some examples, the maximum thickness of the conductive trace on the first and/or second sides at or near edges 1101 and 1103 can be greater than the maximum thickness on the third side.

Figure 11C:
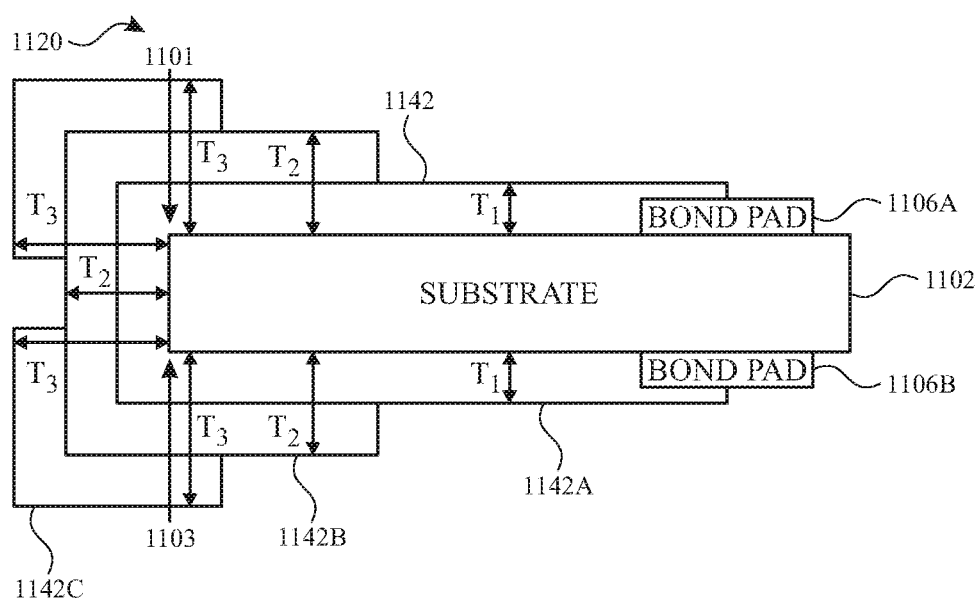

FIG. 11C illustrates a touch sensor panel 1120 with a non-uniform thickness for conductive trace 1142 between first bond pad 1106A and first edge 1101, between second bond pad 1106B and second edge 1103, and between first edge 1101 and second edge 1103. In FIG. 11C, the increase in thickness of conductive trace 1142 at or near edges 1101 and 1103 compared with the thickness of conductive trace 1142 at or near the bond pads 1106A, 1106B can occur via multiple linear or non-linear steps. For example, FIG. 11B illustrates one step from thickness $T_1$ to $T_2$. FIG. 11C illustrates two steps from thickness $T_1$ to $T_2$ to $T_3$. Additional steps are possible in other examples.

Figure 11D:
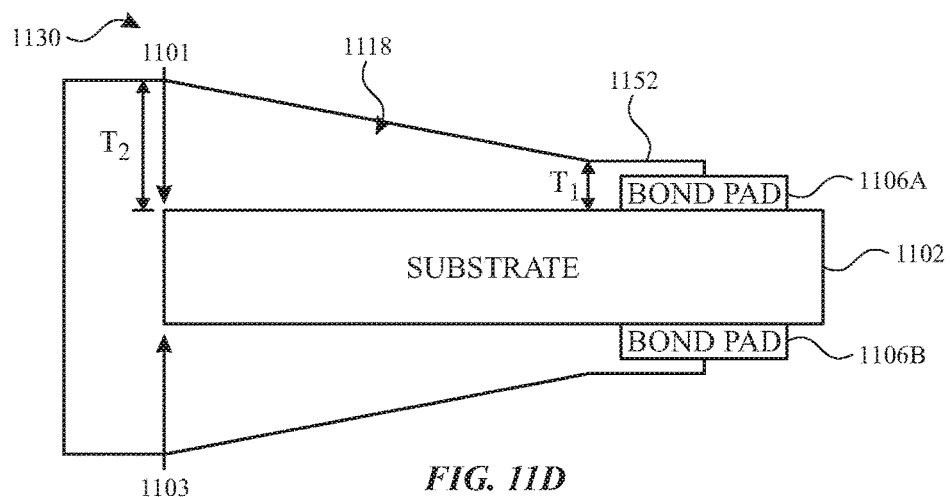

FIG. 11D illustrates a touch sensor panel 1130 with a non-uniform thickness for conductive trace 1152 between first bond pad 1106A and first edge 1101 and between second bond pad 1106B and second edge 1103. The increase in thickness can be linear (sloping rather than stepping). For example, the thickness can increase from a first thickness $T_1$ near bond pad 1006A to a thickness $T_2$ at or near first edge

1101. The increase is shown by linear slope 1118. The increase in thickness of conductive trace 1152 can be similar on the second side of substrate 1102. In other words, the thickness of conductive material 1152 can taper linearly from a thickness $T_2$ at or near the edges to a thickness $T_1$ at or near the bond pads (e.g., as the distance to the first edge of the increases). Although a linear increase (or a linear taper) is illustrated in FIG. 11D, it should be understood that a non-linear increase (or taper) could be used instead.

In some examples, the added conductive material can increase the thickness of the conductive trace such that the thickness at the edge of the substrate (e.g., measured from the first side or third side) is greater than 5 microns, so as to provide improved structural stability. In some examples, the thickness at the edge of the substrate can be between 1-10 microns to provide improved structural stability.

The above description of varying thicknesses of the conductive traces with respect to FIGS. 11A-11D primarily focuses on the portion of the conductive traces between the bond pad and an edge or between the first and second edges (e.g., the third side). As shown in FIGS. 11A-11D, the conductive traces (e.g., conductive traces 1122, 1132, 1143, 1152) can also, in some examples, at least partially overlap the bond pad (e.g., to form an electrical connection for routing). In some examples, the thickness from top of the conductive trace to the substrate (including the intervening bond pad) can have a thickness $T_1$ equal to the thickness at or near, but not overlapping, the bond pad. In some examples, the thickness of the conductive trace overlapping the bond pad can be less than 20 microns to enable proper electrical contact between the bond pad and the flex circuit during bonding (e.g., ACF bonding). In some examples, the thickness of the conductive trace overlapping the bond pad can be between 5-15 microns. In some examples, the thickness of the conductive trace overlapping the bond pad can be between 1-10 microns.

Figure 12:
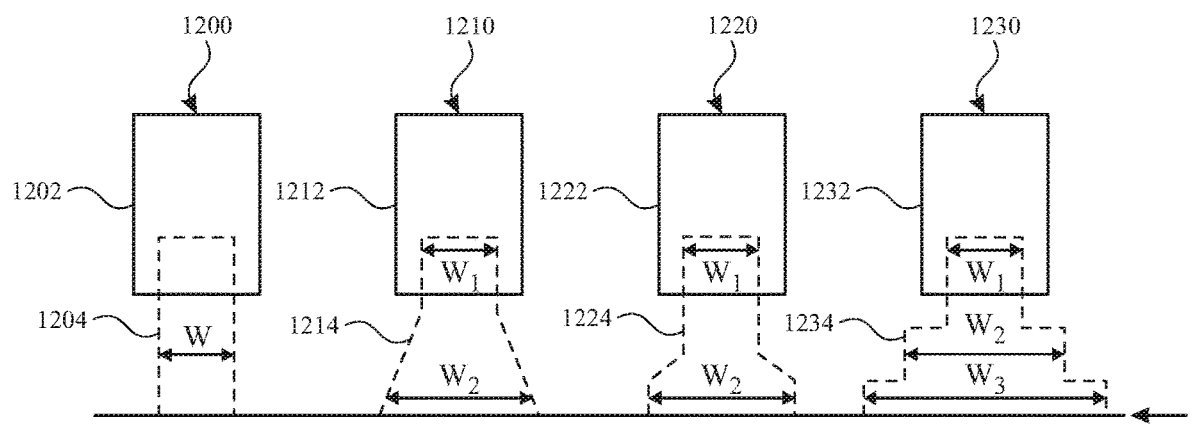
FIG. 12 illustrates exemplary conductive traces with variable width according to examples of the disclosure.

FIG. 12 illustrates exemplary conductive traces with variable width according to examples of the disclosure. FIG. 12 includes four exemplary configurations 1200, 1210, 1220 and 1230 with conductive traces 1204, 1214, 1224, and 1234 routed from bond pads 1202, 1212, 1222, and 1232 to the substrate edge (indicated by an arrow in FIG. 12). The conductive traces can be wrapped around (e.g., to a second side) or otherwise routed off of the substrate to touch sensing circuitry. For ease of description and illustration, one side (e.g., the first (top) side) is shown, but it should be understood that the width of the traces can be increase near the edges for other sides (the second (bottom) side and/or the third side).

For reference, FIG. 12 includes configuration 1200 including bond pad 1202 and conductive trace 1204 (e.g., corresponding to bond pad 906 and conductive trace 922). Conductive trace 1204 can have a uniform width from bond pad 1202 to the edge of the substrate. In some examples, the width of the conductive trace can be increased to improve structural stability. In some examples, the width of the conductive trace can increase linearly from the bond pad to the edge. For example, configuration 1210 illustrates a linear increase for conductive trace 1214 from width $W_1$ at or near bond pad 1212 to $W_2$ at or near the edge. In other words, conductive trace 1214 can taper from $W_2$ at or near the edge to $W_1$ at or near the bond pad (e.g., as the distance to the first edge of the substrate increases). In some examples, the increase (or taper) can be non-linear. For example, configuration 1220 illustrates a non-linear increase for conductive trace 1224 from width $W_1$ at or near bond pad 1222 to $W_2$ at or near the edge. In some examples, the increase can be step-wise, such that each step increases (or narrows from the tapering perspective) the width from one width to another width. For example, configuration 1230 illustrates two step increase for the conductive trace 1234 from width $W_1$ at or near bond pad 1232 to $W_2$ to $W_3$ at or near the edge (where $W_3 > W_2 > W_1$). The number of steps can be greater than (3, 5, etc.) or less than (e.g., 1) the two steps illustrated in configuration 1230 in FIG. 12.

Although varying thickness/width of the conductive trace are shown separately in FIGS. 11-12, it is understood that both the thickness and width can vary for the conductive trace. For example, the width of the conductive trace can increase at or near the edge as shown in configuration 1220 of FIG. 12 and the thickness of the conductive trace can increase at or near the edge as shown in touch sensor panel 1130 in FIG. 11D. Additionally, although FIGS. 11 and 12 illustrate bond pads as shown in FIGS. 9A-9B (without a copper tail to the edge of the substrate) it should be understood that similar principles of FIGS. 11-12 can be applied for conductive traces overlaid over bond pads with a tail portion as shown in FIGS. 10A-10C.

Although the terms bond pad or bond pads are used herein to refer to conductive region(s) representing the signal terminus of touch electrode(s) in or near the border region, it should be understood that in some examples, as described herein, a bond to a flexible circuit (e.g., via ACF bonding) may ultimately not be made to the bond pad(s). For example, the flex circuit bond may be made on one side of the substrate leaving the bond pads on the opposite side without a flex circuit bond. In some examples, a bond pad without a flex circuit bond may be referred to a terminus or signal terminus of a touch electrode.

Therefore, according to the above, some examples of the disclosure are directed to a touch sensor panel. The touch sensor panel can comprise a substrate including a first side and a second side, a first plurality of touch electrodes formed on the first side of the substrate, a second plurality of touch electrodes formed on the second side of the substrate opposite the first side of the substrate, and conductive traces configured to route the first plurality of touch electrodes from the first side of the substrate around one or more edges of the substrate (e.g., around a first edge defining a boundary of the first side of the substrate, and around a second edge defining a boundary of the second side, and around a third side of the substrate between the first side and the second side) to the second side of the substrate. Additionally or alternatively to one or more of the examples disclosed above, in some examples, the touch sensor panel can further comprise a first plurality of bond pads formed on the first side of the substrate coupled to the first plurality of touch electrodes and a second plurality of bond pads formed on the second side of the substrate coupled to the second plurality of touch electrodes. Additionally or alternatively to one or more of the examples disclosed above, in some examples, the touch sensor panel can further comprise a third plurality of bond pads formed on the second side of the substrate coupled to the first plurality of touch electrodes via the conductive traces. Additionally or alternatively to one or more of the examples disclosed above, in some examples, the touch sensor panel can further comprise a flex circuit bonded to the second side of the substrate coupled to the first plurality of touch electrodes via the conductive traces and coupled to the second plurality of touch electrodes. Additionally or alternatively to one or more of the examples disclosed above, in some examples, the first plurality of touch electrodes and the second plurality of touch electrodes can be formed from a semiconductor material. Additionally or alternatively to one or more of the examples disclosed above, in some examples, the semiconductor material can be indium tin oxide. Additionally or alternatively to one or more of the examples disclosed above, in some examples, the conductive traces can be formed from a metallic paste. Additionally or alternatively to one or more of the examples disclosed above, in some examples, the metallic paste can be a silver paste. Additionally or alternatively to one or more of the examples disclosed above, in some examples, the metallic paste can be a copper paste.

Some examples of the disclosure are directed to a method of fabricating a touch sensor panel. The method can comprise forming a first plurality of touch electrodes on a first side of a substrate of the touch sensor panel; forming a second plurality of touch electrodes on a second side of the substrate of the touch sensor panel; and forming conductive traces configured to route the first plurality of touch electrodes from the first side of the substrate around one or more edges of the substrate to the second side of the substrate.

Some examples of the disclosure are directed to a touch sensor panel. The touch sensor panel can comprise a substrate, a plurality of touch electrodes disposed on a first surface of the substrate, and a flex circuit coupled to the substrate and oriented perpendicular to the first surface of the substrate. The flex circuit can include one or more conductive traces coupled to the plurality of touch electrodes. Additionally or alternatively to one or more of the examples disclosed above, in some examples, the touch sensor panel can further comprise: a PCB, the PCB having a first portion parallel to the first surface of the substrate and a second portion perpendicular to the first surface of the substrate. Additionally or alternatively to one or more of the examples disclosed above, in some examples, the first portion of the PCB can be bonded to the first surface of the substrate with an adhesive. Additionally or alternatively to one or more of the examples disclosed above, in some examples, the first portion of the PCB can be bonded to a second surface of the substrate with an adhesive, the second surface of the substrate opposite the first surface of the substrate. Additionally or alternatively to one or more of the examples disclosed above, in some examples, the touch sensor panel can further comprise conductive bonding disposed between the PCB and the flex circuit that electrically and mechanically couples the flex circuit to the PCB. Additionally or alternatively to one or more of the examples disclosed above, in some examples, the touch sensor panel can further comprise a strain relief coupled to the flex circuit. Additionally or alternatively to one or more of the examples disclosed above, in some examples, at least part of the one or more conductive traces are disposed between the flex circuit and the strain relief. Additionally or alternatively to one or more of the examples disclosed above, in some examples, the touch sensor panel can further comprise: a plurality of bond pads coupled to the plurality of touch electrodes; one or more conductive traces configured to wrap around from the first surface of the substrate to electrically couple the plurality of bond pads to the one or more conductive traces of the flex circuit; and potting including a first section disposed parallel to a plane of the first surface of the substrate and a second section disposed perpendicular to the first surface of the substrate. At least part of the one or more conductive traces configured to wrap around from the first surface can be disposed between the flex circuit and the potting. Additionally or alternatively to one or more of the examples disclosed above, in some examples, the touch sensor panel can further comprise an optical polarizer, the optical polarizer coupled to a second surface of the substrate opposite the first surface of the substrate. The flex circuit can be coupled to the substrate and the optical polarizer via an adhesive.

Some examples of the disclosure are directed to a method of forming a touch sensor panel. The method can comprise forming a plurality of touch electrodes on a first surface of a substrate; and coupling a flex circuit to the substrate, the flex circuit oriented perpendicular to the first surface of the substrate, the flex circuit including one or more conductive traces coupled to the plurality of touch electrodes. Additionally or alternatively to one or more of the examples disclosed above, in some examples, the method can further comprise forming the one or more conductive traces between the plurality of touch electrodes and the one or more conductive traces of the flex circuit by applying an aerosolized conductive material to the touch sensor panel.

Some examples of the disclosure are directed to a touch sensor panel comprising a substrate including a first side and a second side; bond pads formed on the first side of the substrate coupled to touch electrodes formed on the first side of the substrate, at least one bond pad of the bond pads formed on the first side of the substrate extends to a first edge of the substrate; and conductive traces routing the bond pads formed on the first side of the substrate off of the first side of the substrate. Additionally or alternatively to one or more of the examples disclosed above, in some examples, the touch sensor panel can further comprise bond pads formed on the second side of the substrate coupled to touch electrodes formed on the second side of the substrate opposite the first side of the substrate. At least of one of the bond pads formed on the second side of the substrate can extend to a second edge of the substrate. The conductive traces can route the bond pads formed on the first side of the substrate off of the first side of the substrate around the first edge of the substrate and around the second edge of the substrate to the second side of the substrate. Additionally or alternatively to one or more of the examples disclosed above, in some examples, a first portion of the at least one bond pad formed on the first side of the substrate within a threshold distance from the first edge of the substrate can be narrower than a second portion of the at least one bond pad formed on the first side of the substrate outside the threshold distance from the first edge. Additionally or alternatively to one or more of the examples disclosed above, in some examples, at least one conductive trace of the conductive traces can overlap the first portion within the threshold distance from the first edge of the substrate. Additionally or alternatively to one or more of the examples disclosed above, in some examples, at least one conductive trace of the conductive traces can overlap some, but not all, of the second portion outside the threshold distance from the first edge of the substrate. Additionally or alternatively to one or more of the examples disclosed above, in some examples, a width of the at least one bond pad formed on the first side of the substrate can taper as a distance to the first edge of the substrate decreases. Additionally or alternatively to one or more of the examples disclosed above, in some examples, the taper can include a first step and a second step. The first step can narrow the width by a first amount and the second step can further narrow the width by a second amount. Additionally or alternatively to one or more of the examples disclosed above, in some examples, the bond pads can be formed from copper and the conductive traces can be formed from silver paste.

Some examples of the disclosure are directed to a touch sensor panel comprising a substrate including a first side and a second side, bond pads formed on the first side of the substrate coupled to touch electrodes formed on the first side of the substrate, and conductive traces routing the bond pads formed on the first side of the substrate off of the first side of the substrate. A first thickness of at least one conductive trace of the conductive traces at a first distance from a first edge can be greater than a second thickness of the at least one of the conductive trace at a second distance from the first edge, the second distance greater than the first distance. Additionally or alternatively to one or more of the examples disclosed above, in some examples, a first width of the at least one conductive trace at the first distance from the first edge can be greater than a second width of the at least one of the conductive trace at the second distance from the first edge. Additionally or alternatively to one or more of the examples disclosed above, in some examples, a width of the at least one conductive trace can taper as a distance to the first edge of the substrate increases. Additionally or alternatively to one or more of the examples disclosed above, in some examples, the taper can include a first step and a second step. The first step can narrow the width by a first amount and the second step can further narrow the width by a second amount. Additionally or alternatively to one or more of the examples disclosed above, in some examples, a thickness of the at least one conductive trace can taper as a distance to the first edge of the substrate increases. Additionally or alternatively to one or more of the examples disclosed above, in some examples, the taper can include a first step and a second step. The first step can narrow the thickness by a first amount and the second step can further narrows the thickness by a second amount. Additionally or alternatively to one or more of the examples disclosed above, in some examples, a thickness of the at least one conductive trace disposed on a third side of the substrate between the first edge of the substrate and a second edge of the substrate can be greater than the thickness of the conductive trace on the first side of the substrate at or near at least one bond pad of the bond pads. Additionally or alternatively to one or more of the examples disclosed above, in some examples, a thickness of the at least one conductive trace overlapping at least one bond pad of the bond pads can be less than 20 microns. Additionally or alternatively to one or more of the examples disclosed above, in some examples, a thickness of the at least one conductive trace at the first edge can be greater than 5 microns. Additionally or alternatively to one or more of the examples disclosed above, in some examples, at least one bond pad of the bond pads can be formed of copper and the copper of the at least one bond pad terminates a threshold distance from the first edge of the substrate. Additionally or alternatively to one or more of the examples disclosed above, in some examples, the conductive traces can route the bond pads formed on the first side of the substrate off of the first side of the substrate around the first edge of the substrate and around a second edge of the substrate to the second side of the substrate.

Some examples of the disclosure are directed to a touch sensor panel. The touch sensor panel can comprise: a substrate; touch electrodes disposed on a first surface of the substrate; and a flex circuit coupled to the substrate and oriented perpendicular to the first surface of the substrate. The flex circuit can include conductive traces coupled to the touch electrodes. Additionally or alternatively to one or more of the examples disclosed above, in some examples, the touch sensor panel can further comprise: a PCB. The PCB can have a first portion parallel to the first surface of the substrate and a second portion perpendicular to the first surface of the substrate. Additionally or alternatively to one or more of the examples disclosed above, in some examples, the PCB can comprise conductive traces routed from the first portion of the PCB to the second portion of the PCB. Additionally or alternatively to one or more of the examples disclosed above, in some examples, the first portion of the PCB can be bonded to the first surface of the substrate with an adhesive. Additionally or alternatively to one or more of the examples disclosed above, in some examples, the first portion of the PCB can be bonded to a second surface of the substrate with an adhesive, the second surface of the substrate opposite the first surface of the substrate. Additionally or alternatively to one or more of the examples disclosed above, in some examples, the touch sensor panel can further comprise: conductive bonding disposed between the second portion of the PCB and the flex circuit that electrically and mechanically couples the flex circuit to the PCB. Additionally or alternatively to one or more of the examples disclosed above, in some examples, the touch sensor panel can further comprise: a strain relief coupled to the flex circuit and coupled to the PCB. Additionally or alternatively to one or more of the examples disclosed above, in some examples, the touch sensor panel can further comprise: bond pads formed on the first surface of the substrate and coupled to the touch electrodes. The conductive traces of the flex circuit can be coupled to the touch electrodes via the bond pads. Additionally or alternatively to one or more of the examples disclosed above, in some examples, the touch sensor panel can further comprise: conductive traces configured to couple the bond pads to the conductive traces of the flex circuit. Additionally or alternatively to one or more of the examples disclosed above, in some examples, the conductive traces configured to couple the bond pads to the conductive traces of the flex circuit can be formed from a metallic paste. Additionally or alternatively to one or more of the examples disclosed above, in some examples, the metallic paste can be a silver paste. Additionally or alternatively to one or more of the examples disclosed above, in some examples, the metallic paste can be a copper paste. Additionally or alternatively to one or more of the examples disclosed above, in some examples, the conductive traces configured to couple the bond pads to the conductive traces of the flex circuit can wrap around from the first surface of the substrate to the flex circuit oriented perpendicular to the first surface of the substrate. Additionally or alternatively to one or more of the examples disclosed above, in some examples, the touch sensor panel can further comprise: potting including a first section disposed parallel to a plane of the first surface of the substrate and a second section disposed perpendicular to the first surface of the substrate. At least part of the conductive traces configured to couple the bond pads to the conductive traces of the flex circuit can be disposed between the flex circuit and the potting. Additionally or alternatively to one or more of the examples disclosed above, in some examples, a first thickness of at least one conductive trace of the conductive traces configured to couple the bond pads to the conductive traces of the flex circuit at a first distance from a first edge of the substrate can be greater than a second thickness of the at least one of the conductive trace at a second distance from the first edge, the second distance greater than the first distance. Additionally or alternatively to one or more of the examples disclosed above, in some examples, a first width of the at least one conductive trace at the first distance from the first edge can be greater than a second width of the at least one of the conductive trace at the second distance from the first edge. Additionally or alternatively to one or more of the examples disclosed above, in some examples, a thickness of the at least one conductive trace overlapping at least one bond pad of the bond pads can be less than 20 microns. Additionally or alternatively to one or more of the examples disclosed above, in some examples, the touch sensor panel can further comprise: an optical polarizer, the optical polarizer coupled to a second surface of the substrate opposite the first surface of the substrate. The flex circuit can coupled to the substrate and the optical polarizer via an adhesive. Additionally or alternatively to one or more of the examples disclosed above, in some examples, the touch electrodes can be formed from indium tin oxide (ITO).

Although the disclosed examples have been fully described with reference to the accompanying drawings, it is to be noted that various changes and modifications will become apparent to those skilled in the art. Such changes and modifications are to be understood as being included within the scope of the disclosed examples as defined by the appended claims.

The invention claimed is:

1. A touch sensor panel, comprising:
   a substrate;
   touch electrodes disposed on a first surface of the substrate; and
   a flex circuit coupled to the substrate via bonding to a second surface of the substrate that is positioned at a non-parallel angle with respect to the first surface of the substrate, wherein a first side of the flex circuit is bonded to the second surface with an adhesive, wherein the flex circuit includes conductive traces coupled to the touch electrodes, and wherein the conductive traces of the flex circuit are disposed on a second side of the flex circuit opposite the first side of the flex circuit.

2. The touch sensor panel of claim 1, further comprising:
   bond pads formed on the first surface of the substrate and coupled to the touch electrodes;
   wherein the conductive traces of the flex circuit are coupled to the touch electrodes via the bond pads.

3. The touch sensor panel of claim 2, further comprising:
   conductive traces configured to couple the bond pads to the conductive traces of the flex circuit.

4. The touch sensor panel of claim 3, wherein the conductive traces configured to couple the bond pads to the conductive traces of the flex circuit are formed from a metallic paste.

5. The touch sensor panel of claim 4, wherein the metallic paste is a silver paste.

6. The touch sensor panel of claim 4, wherein the metallic paste is a copper paste.

7. The touch sensor panel of claim 3, wherein the conductive traces configured to couple the bond pads to the conductive traces of the flex circuit wrap around from the first surface of the substrate to the flex circuit oriented perpendicular to the first surface of the substrate.

8. The touch sensor panel of claim 3, further comprising:
   potting including a first section disposed parallel to a plane of the first surface of the substrate and a second section disposed perpendicular to the first surface of the substrate, wherein, at least part of the conductive traces configured to couple the bond pads to the conductive traces of the flex circuit are disposed between the flex circuit and the potting.

9. The touch sensor panel of claim 3, wherein a first thickness of at least one conductive trace of the conductive traces configured to couple the bond pads to the conductive traces of the flex circuit at a first distance from a first edge of the substrate is greater than a second thickness of the at least one of the conductive trace at a second distance from the first edge, the second distance greater than the first distance.

10. The touch sensor panel of claim 9, wherein a first width of the at least one conductive trace at the first distance from the first edge is greater than a second width of the at least one of the conductive trace at the second distance from the first edge.

11. The touch sensor panel of claim 9, wherein a thickness of the at least one conductive trace overlapping at least one bond pad of the bond pads is less than 20 microns.

12. The touch sensor panel of claim 1, further comprising:
    an optical polarizer, the optical polarizer coupled to a third surface of the substrate opposite the first surface of the substrate, wherein
    the flex circuit is bonded to the second surface of the substrate and bonded to the optical polarizer with the adhesive.

13. The touch sensor panel of claim 12, wherein the flex circuit is bonded to the polarizer with a second adhesive different than the adhesive bonding the flex circuit to the substrate and to the optical polarizer.

14. The touch sensor panel of claim 12, further comprising a strain relief coupled to the flex circuit and coupled to the optical polarizer.

15. The touch sensor panel of claim 1, wherein the touch electrodes are formed from indium tin oxide (ITO).

16. The touch sensor panel of claim 1, wherein the second surface of the substrate is perpendicular to the first surface of the substrate.

17. The touch sensor panel of claim 1, further comprising a strain relief coupled to the flex circuit and coupled to the substrate.

18. The touch sensor panel of claim 1, wherein the adhesive is non-conductive such that the bond between the second surface of the substrate and the flex circuit is non-conductive.

19. The touch sensor panel of claim 1, further comprising:
    conductive traces configured to couple the touch electrodes to the conductive traces of the flex circuit, wrapping around from the first surface of the substrate to the conductive traces of the flex circuit on the second side of the flex circuit.

20. A touch sensor panel, comprising:
    a substrate;
    touch electrodes disposed on a first surface of the substrate;
    bond pads formed on the first surface of the substrate and coupled to the touch electrodes;
    a flex circuit coupled to the substrate via bonding to a surface that is positioned at a non-parallel angle with respect to the first surface of the substrate, the flex circuit including conductive traces coupled to the touch electrodes; and
    conductive traces configured to couple the bond pads to the conductive traces of the flex circuit;
    wherein the conductive traces of the flex circuit are coupled to the touch electrodes via the bond pads and the conductive traces configured to couple the bond pads to the conductive traces of the flex circuit; and
    wherein a first thickness of at least one conductive trace of the conductive traces configured to couple the bond pads to the conductive traces of the flex circuit at a first distance from a first edge of the substrate is greater than a second thickness of the at least one of the conductive trace at a second distance from the first edge, the second distance greater than the first distance.

21. A touch sensor panel, comprising:
a substrate;
touch electrodes disposed on a first surface of the substrate;
bond pads formed on the first surface of the substrate and coupled to the touch electrodes;
a flex circuit coupled to the substrate via bonding to a surface that is positioned at a non-parallel angle with respect to the first surface of the substrate, the flex circuit including conductive traces coupled to the touch electrodes; and
conductive traces configured to couple the bond pads to the conductive traces of the flex circuit;
wherein the conductive traces of the flex circuit are coupled to the touch electrodes via the bond pads and the conductive traces configured to couple the bond pads to the conductive traces of the flex circuit; and
wherein a first width of at least one conductive trace of the conductive traces configured to couple the bond pads to the conductive traces of the flex circuit at a first distance from a first edge of the substrate is greater than a second width of the at least one of the conductive trace at a second distance from the first edge, the second distance greater than the first distance.

* * * * *